US010755969B2

(12) United States Patent
Chu et al.

(10) Patent No.: US 10,755,969 B2
(45) Date of Patent: Aug. 25, 2020

(54) MULTI-PATTERNING TECHNIQUES FOR FABRICATING AN ARRAY OF METAL LINES WITH DIFFERENT WIDTHS

(71) Applicant: International Business Machines Corporation, Armonk, NY (US)

(72) Inventors: Albert Chu, Nashua, NH (US); Kafai Lai, Poughkeepsie, NY (US); Lawrence A. Clevenger, Rhinebeck, NY (US)

(73) Assignee: International Business Machines Corporation, Armonk, NY (US)

(*) Notice: Subject to any disclaimer, the term of this patent is extended or adjusted under 35 U.S.C. 154(b) by 266 days.

(21) Appl. No.: 15/859,675

(22) Filed: Jan. 1, 2018

(65) Prior Publication Data

US 2019/0206725 A1 Jul. 4, 2019

(51) Int. Cl.
*H01L 21/768* (2006.01)
*H01L 23/498* (2006.01)

(52) U.S. Cl.
CPC .... *H01L 21/76816* (2013.01); *H01L 21/7688* (2013.01); *H01L 21/76817* (2013.01); *H01L 21/76831* (2013.01); *H01L 21/76897* (2013.01); *H01L 21/76898* (2013.01); *H01L 23/49827* (2013.01)

(58) Field of Classification Search
CPC .......... H01L 21/76816; H01L 21/7688; H01L 21/3086; H01L 21/0337
See application file for complete search history.

(56) References Cited

U.S. PATENT DOCUMENTS

| 7,709,396 | B2* | 5/2010 | Bencher ............. H01L 21/3086 438/597 |
| 8,673,165 | B2 | 3/2014 | Raghunathan et al. |
| 8,679,981 | B1 | 3/2014 | Weling et al. |
| 9,070,448 | B2 | 6/2015 | Min et al. |
| 9,117,654 | B2 | 8/2015 | Lee et al. |
| 2007/0238308 | A1 | 10/2007 | Niroomand et al. |
| 2007/0249174 | A1 | 10/2007 | Yang |
| 2008/0220600 | A1 | 9/2008 | Alapati et al. |
| 2010/0297850 | A1 | 11/2010 | Kim et al. |
| 2012/0045901 | A1* | 2/2012 | Kim .................... H01L 21/0337 438/703 |
| 2013/0001750 | A1 | 1/2013 | Arnold et al. |
| 2014/0083972 | A1* | 3/2014 | Oyama ................ H01B 13/003 216/13 |
| 2014/0273442 | A1* | 9/2014 | Liu ................... H01L 21/31111 438/666 |

* cited by examiner

*Primary Examiner* — Tuan A Hoang
(74) *Attorney, Agent, or Firm* — Vazken Alexanian; Ryan, Mason & Lewis, LLP

(57) ABSTRACT

Multi-patterning methods are provided for use in fabricating an array of metal lines comprising metal lines with different widths. For example, patterning methods implement spacer-is-dielectric (SID)-based self-aligned double patterning (SADP) methods for fabricating an array of metal lines comprising elongated metal lines with different widths, wherein an "unblock" mask is utilized as part of the process flow to overlap mandrel assigned and non-mandrel assigned features in a given SADP pattern to define regions to unblock a metal fill (remove dielectric material between wires) in a dielectric layer between defined metal lines of an a SADP pattern thus enabling the formation of wide metal lines within any region of a pattern of elongated metal lines formed with a minimum feature width.

16 Claims, 18 Drawing Sheets

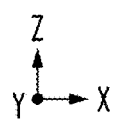
*FIG. 11A*
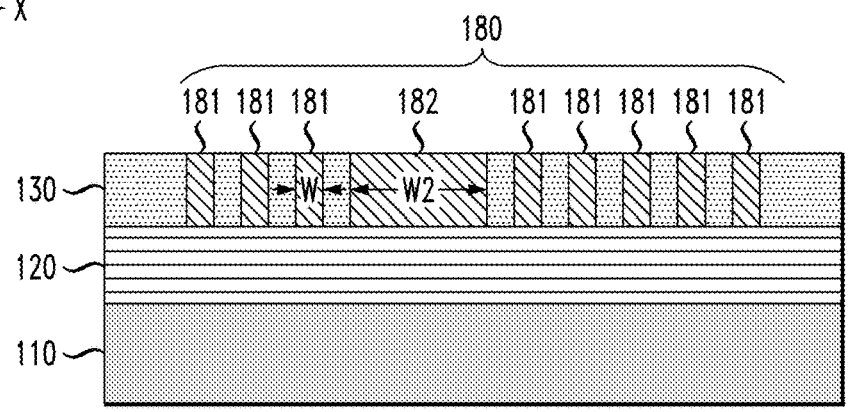
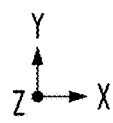
*FIG. 11B*
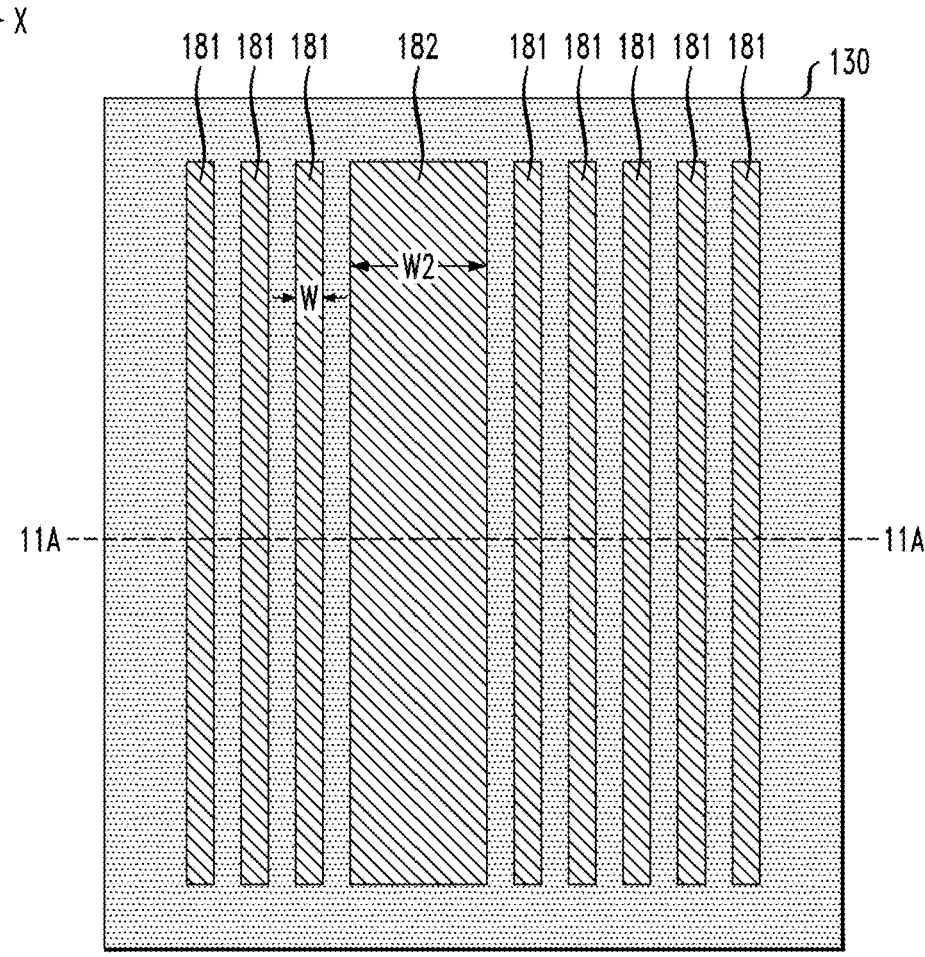

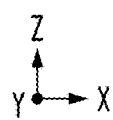
*FIG. 13A*
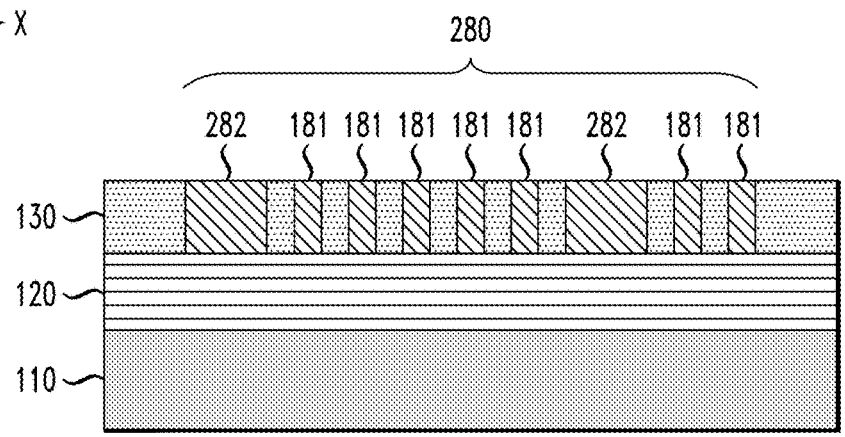
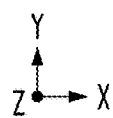
*FIG. 13B*
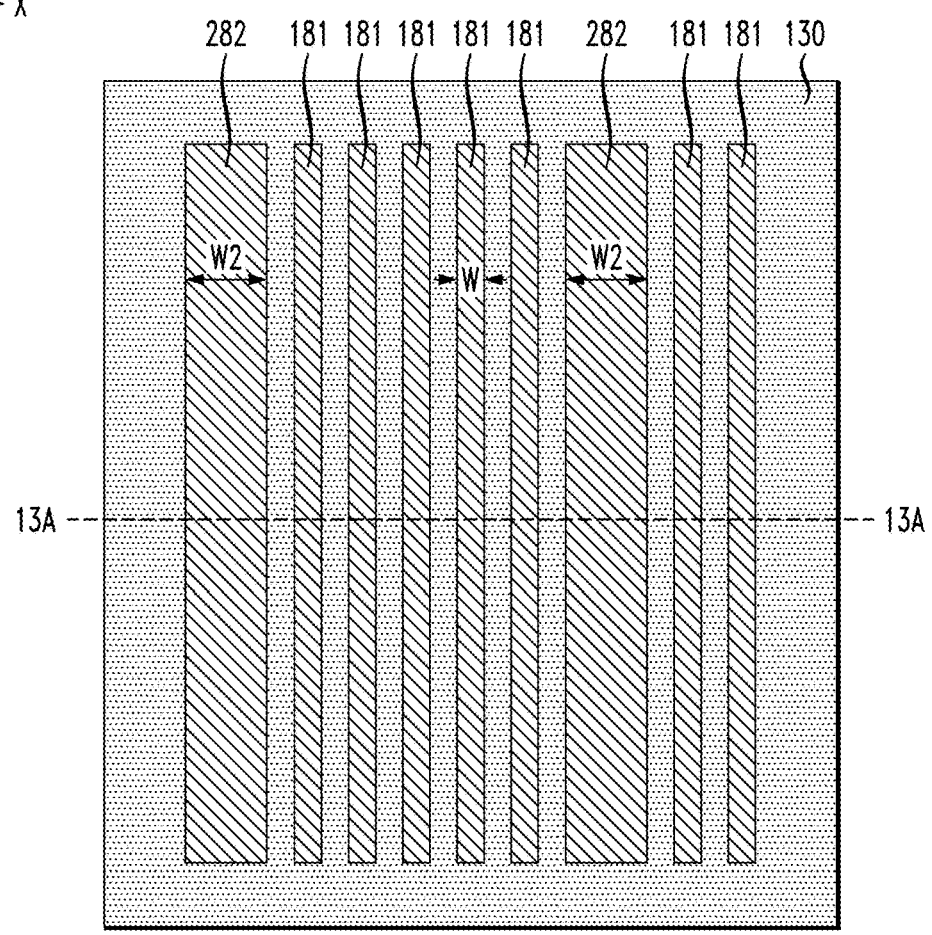

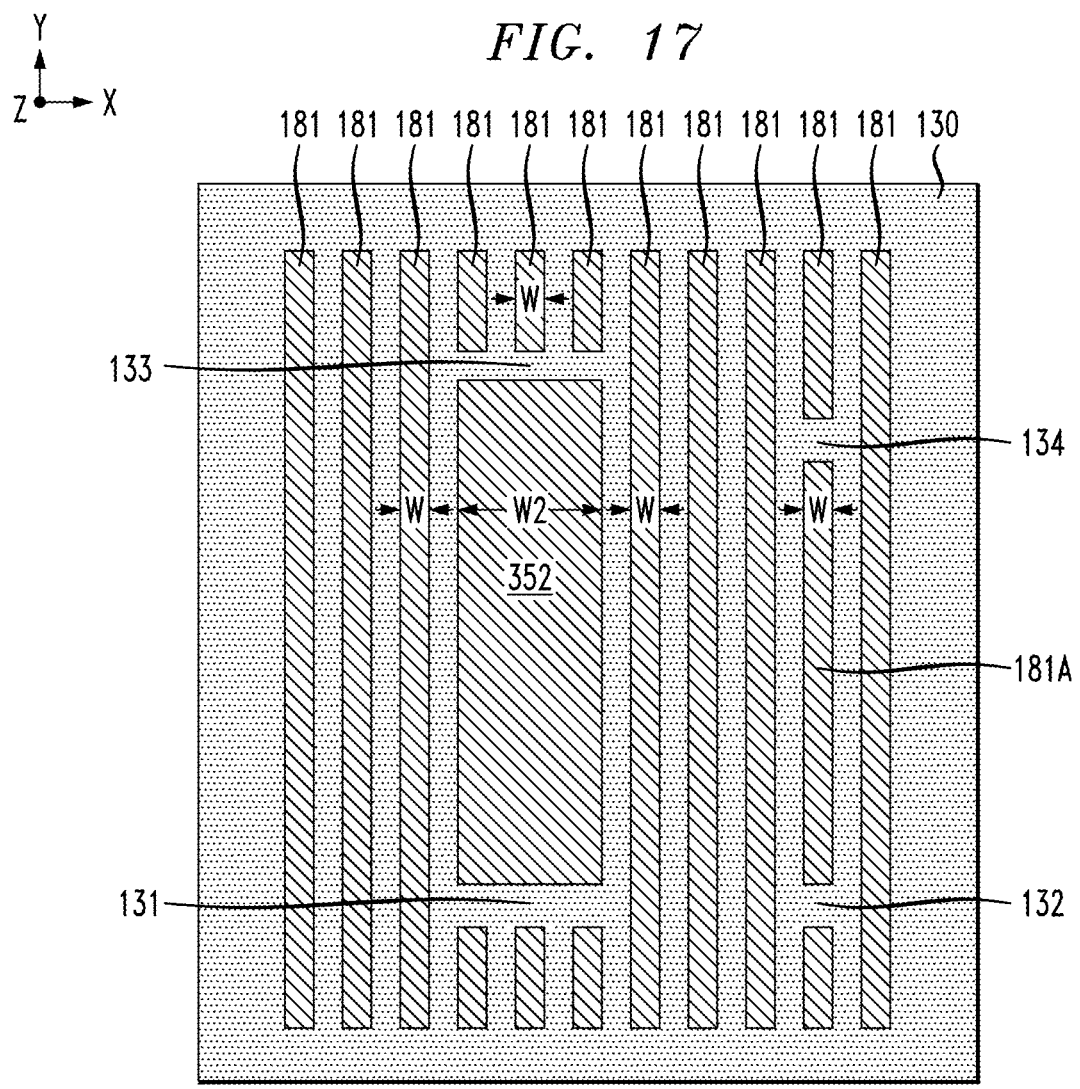

MULTI-PATTERNING TECHNIQUES FOR FABRICATING AN ARRAY OF METAL LINES WITH DIFFERENT WIDTHS

TECHNICAL FIELD

This disclosure generally relates to semiconductor integrated circuit fabrication techniques and, more specifically, to multi-patterning methods for use in fabricating back-end-of line (BEOL) wiring for semiconductor integrated circuits.

BACKGROUND

Various types of multi-patterning photolithography techniques can be utilized to manufacture semiconductor integrated circuits. Such multi-patterning techniques include sidewall image transfer (SIT), self-aligned doubled patterning (SADP), and self-aligned quadruple patterning (SAQP) techniques, for example. The current SIT, SADP and SAQP methods utilize deposition and etch back processes to create uniform memorization and transfer elements. In particular, these techniques involve spacer patterning steps in which spacers are formed on the sidewalls of sacrificial features (e.g., sacrificial mandrels), wherein the sacrificial features are removed to leave a pattern of spacers which is used to etch features into an underlying layer at sub-lithographic dimensions. One type of SADP method, referred to as spacer-is-dielectric (SID), utilizes the spacers (not sacrificial mandrels) to define dielectric spaces between target features (e.g., metal lines). This is in contrast to other SADP methods in which the spacers define the conductive features (metallization), and wherein an extra cut mask is needed to cut the portions of the spacers which wrap around the end portions of the mandrels to avoid forming conductive loops.

SID SADP techniques are commonly utilized in back-end-of-line (BEOL) process flows for fabricating a metallization level comprising an array of parallel metal lines with uniform widths (e.g., minimum width—1X) and spacing. However, in some metallization levels, wider wires (e.g., greater than 1X) are desired to implement power rails, clock networks, analog wires, etc. The formation of wider wires (greater than minimum width 1X) can be supported in SADP with severe limitations. For example, in a SID SADP process flow, the spacer width is fixed, while mandrel assigned feature width and non-mandrel assigned feature widths can be modulated to pattern wider wires. However, the insertion of a single wide wire in an array of uniform wide wires requires a pair of wide wires to align the mandrel/non-mandrel assignment. Furthermore, wider mandrel shapes present a challenge to the lithography fidelity of adjacent 1X-width features.

SUMMARY

Embodiments of the invention include multi-patterning methods for use in fabricating an array of metal lines comprising metal lines with different widths. For example, one embodiment includes a method which comprises: forming a hardmask layer on an insulating layer of a substrate; forming a pattern of elongated sacrificial features on a hardmask layer, wherein the elongated sacrificial features are spaced apart at a first pitch, and wherein spaces between adjacent elongated sacrificial features define a minimum width of metal lines to be formed in the insulating layer; patterning the hardmask layer using the pattern of elongated sacrificial features as an etch mask to form an etch hardmask, wherein the etch hardmask comprises elongated trenches formed down to the insulating layer, wherein the elongated trenches of the etch hardmask have widths that are equal to the minimum width; removing the pattern of elongated features to expose the etch hardmask; forming an unblock mask over the etch hardmask, wherein the unblock mask comprises an opening to expose a portion of the etch hardmask; removing the portion of the etch hardmask that is exposed through the opening of the unblock mask to form a wider elongated trench in the etch hardmask, wherein the wider elongated trench has a second width which is greater than the minimum width of the elongated trenches of the etch hardmask; removing the unblock mask; patterning the insulating layer using the etch hardmask to form a pattern of elongated trenches in the insulating layer, wherein the pattern of elongated trenches in the insulating layer comprises elongated trenches having the minimum width, and at least one wider elongated trench having the second width; and filling the elongated trenches in the insulating layer with metallic material to form a pattern of metal lines, wherein the pattern of metal lines comprises metal lines having the minimum width and at least one wider metal line having the second width.

Another embodiment of the invention includes a semiconductor device which comprises a BEOL structure formed on a semiconductor substrate, wherein the BEOL structure comprises at least one metallization layer comprising a pattern of elongated parallel metal lines, wherein the pattern of elongated metal lines comprises a plurality of metal lines having a minimum width and at least one wider metal line having the second width which is greater than the minimum width, wherein a minimum width metal line is disposed next to each elongated side of the at least one wider metal line.

Other embodiments will be described in the following detailed description of embodiments, which is to be read in conjunction with the accompanying figures.

BRIEF DESCRIPTION OF THE DRAWINGS

FIGS. 1A through 11B schematically illustrate a multi-patterning method for fabricating an array of metal lines with different widths according to an embodiment of the invention, wherein:

FIGS. 1A and 1B are schematic views of a semiconductor integrated circuit device at an intermediate stage of fabrication in which a pattern of sacrificial mandrels is formed on an upper surface of a substrate;

FIG. 2 is a schematic view of the semiconductor structure of FIG. 1A after forming a conformal layer of spacer material over the surface of the semiconductor structure to conformally cover the sacrificial mandrels;

FIG. 10 is a schematic cross-sectional side view of the semiconductor structure shown in FIG. 9A after patterning the insulating layer using the patterned hardmask layer as an etch hardmask to form trenches in the insulating layer; and FIGS. 11A and 11B are schematic views of the semiconductor structure of FIG. 10 after filling the trenches in the insulating layer with metallic material to form an array of metal lines.

FIGS. 12, 13A, and 13B schematically illustrate a multi-patterning method for fabricating an array of metal lines comprising metal lines with different widths, according to another embodiment of the invention, wherein:

FIG. 12 is a schematic cross-sectional side view of the semiconductor structure shown in FIG. 7A, after forming an unblock mask comprising two separate openings to expose non-adjacent hardmask features in different regions of a patterned hardmask layer, which are to be removed prior to patterning an insulating layer; and FIGS. 13A and 13B are schematic views of the semiconductor structure shown in FIG. 12 after patterning the hardmask layer using the unblock mask, removing the unblock mask, patterning the insulating layer using the patterned hardmask layer as an etch hardmask to form trenches in the insulating layer, and then filling the trenches with a metallic material to form an array of metal lines in the insulating layer.

FIGS. 14A through 17 schematically illustrate a multi-patterning method for fabricating an array of metal lines comprising metal lines with different widths and cuts, according to another embodiment of the invention, wherein:

FIGS. 14A and 14B are schematic views of the semiconductor structure shown in FIGS. 4A and 4B, respectively, after forming a cut mask to expose portions of the hardmask layer which are to be etched;

FIG. 16 is a schematic top plan view of the semiconductor structure shown FIG. 15B after forming an unblock mask to expose portions of the patterned hardmask layer which are to be removed prior to patterning the insulating layer; and FIG. 17 is a schematic top plan view of the semiconductor structure shown FIG. 16 after removing the unblock mask, patterning the insulating layer using the patterned hardmask layer as an etch mask to etch trenches in the insulating layer, and filling the trenches with a metallic material to form an array of metal lines in the insulating layer.

DETAILED DESCRIPTION

Figure 1A:
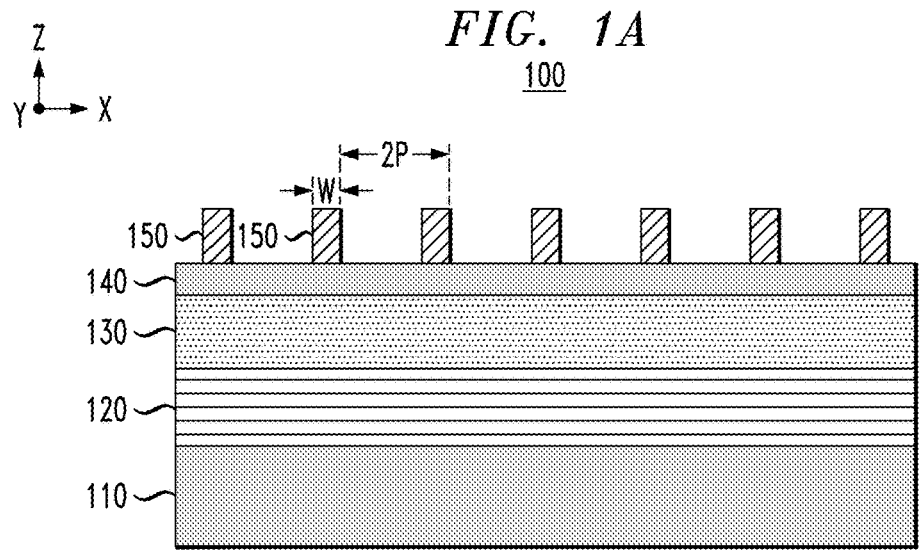

Embodiments of the invention will now be described in further detail with regard to multi-patterning methods for use in fabricating an array of metal lines comprising metal lines with different widths. For illustrative purposes, patterning methods according to embodiments of the invention will be discussed in the context of BEOL process modules which implement SID-based SADP methods for fabricating a metal line array comprising metal lines with different widths. As explained in further detail below, an SID-based SADP process module utilizes an "unblock" mask which overlaps mandrel and non-mandrel features in a given SADP pattern to define regions to unblock a metal fill (remove dielectric between wires) in the SADP pattern, thus enabling the insertion of wide lines anywhere within a pattern of minimum feature width (1X) metal wires formed by the SADP process, without restrictions. In other embodiments, block (line end cut) patterns are utilized to form terminated wide wires in the structure. A structure comprising at least one wide wire segment inserted at any desired location in an array of minimum width wires formed by a SID Mx SADP process.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
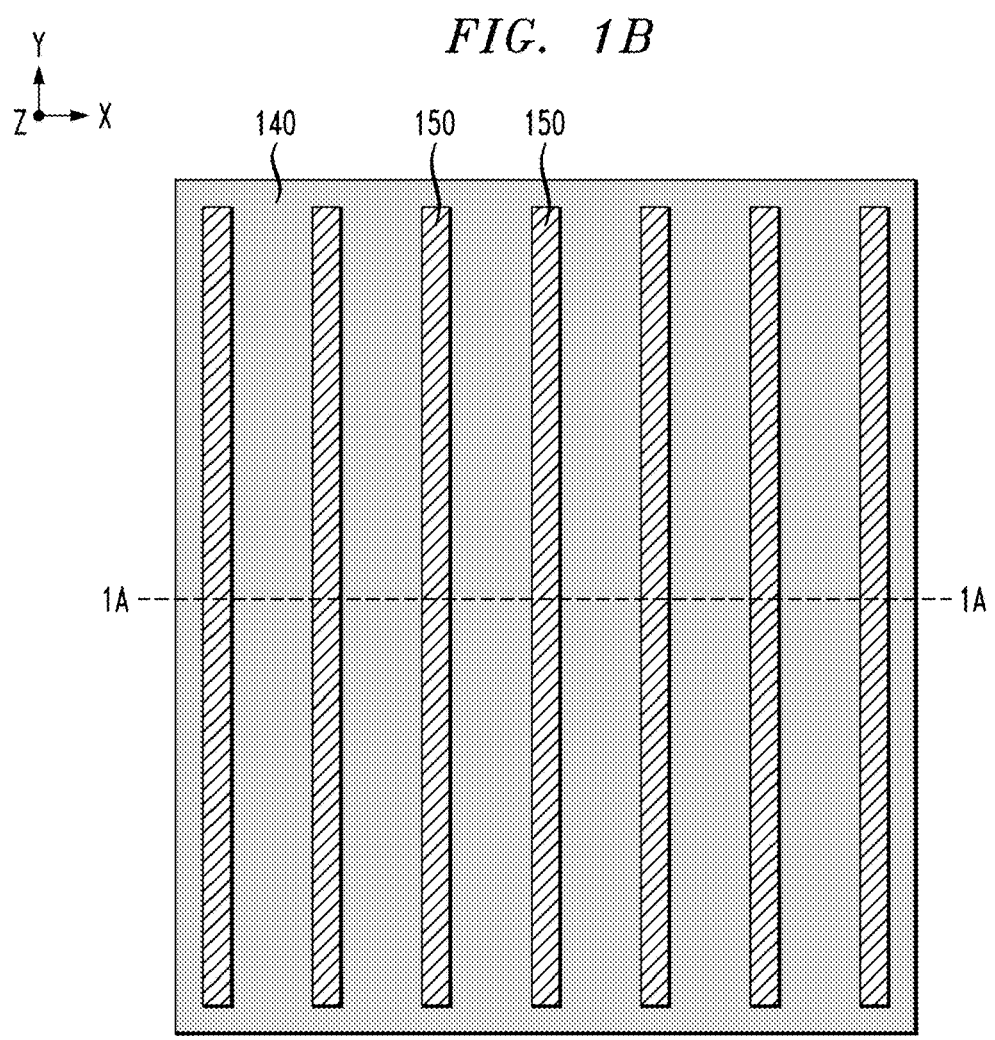

FIGS. 1A through 11B schematically illustrate a multi-patterning method for fabricating an array of metal lines comprising metal lines with different widths, according to an embodiment of the invention. In particular, FIGS. 1A and 1B are schematic views of a semiconductor integrated circuit device 100 at an intermediate stage of fabrication in which a plurality of sacrificial mandrels are formed on an upper surface of a substrate. FIG. 1B is schematic top plan view (X-Y plane) of the semiconductor structure, while FIG. 1A is a cross-sectional side view of the semiconductor structure along line 1A-1A shown in FIG. 1B. The semiconductor integrated circuit device 100 comprises a semiconductor substrate 110 (e.g., semiconductor wafer), a FEOL (front-end-of-line)/MOL (middle-of-line) structure 120 formed on the semiconductor substrate 110, an insulating layer 130, a hardmask layer 140, and a pattern of sacrificial mandrels 150 formed on the hardmask layer 140.

While the semiconductor substrate 110 is illustrated as a generic substrate layer, it is to be understood that the semiconductor substrate 110 may comprise one of different types of semiconductor substrate structures and materials. For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. It is to be noted that in each drawing, the X-Y plane represents a plane that is parallel to the plane of the semiconductor substrate 110 (e.g., wafer) being processed.

The FEOL/MOL structure 120 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, vertical FET devices, planar MOSFET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 120.

A BEOL structure is formed on the FEOL/MOL structure to connect the various integrated circuit components of the FEOL layer. As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the exemplary embodiment of FIGS. 1A and 1B the insulating layer 130 may be an insulating layer which is formed as part of a MOL layer (e.g., pre-metal dielectric layer) or an interlevel dielectric layer (ILD layer) that is part of an interconnect level of a BEOL layer. For purposes of illustration, it is assumed that the insulating layer 130 comprises an ILD layer of the BEOL layer which is to be patterned using multi-patterning methods as discussed herein to form a metallization layer. As an ILD layer, the insulating layer 130 can be formed using any suitable dielectric material including, but not limited to, silicon oxide (e.g. SiO2), SiN (e.g., (Si3N4), hydrogenated silicon carbon oxide (SiCOH), silicon-based low-k dielectrics, porous dielectrics, or other known ULK (ultra-low-k) dielectric materials. The insulating layer 130 can be deposited using known deposition techniques, such as, for example, ALD (atomic layer deposition), CVD (chemical vapor deposition) PECVD (plasma-enhanced CVD), or PVD (physical vapor deposition). The thickness of the insulating layer 130 will define a thickness of the metal lines that are to be formed in the insulating layer 130, which will vary depending on the application (e.g., the insulating layer 130 can have a thickness in a range of 30 nm to about 200 nm).

The hardmask layer 140 is formed on the insulating layer 130 using known deposition techniques. In one embodiment, the hardmask layer 140 is formed of a material that has etch selectivity with respect to the materials of the insulating layer 130 and the sacrificial material that forms the array of sacrificial mandrels 150. For example, the hardmask layer 140 can be formed of a nitride material such as TiN or SiN, etc.

As shown in FIG. 1B, the array of sacrificial mandrels 150 comprises a plurality of elongated sacrificial mandrel features that extend (in a Y-direction) to perimeter (border) regions of a target region being processed. The array of sacrificial mandrels 150 further comprises one or more dummy mandrel features that are added to fill the target region laterally (X-direction), resulting in a pattern of sacrificial mandrels that appears as a grating pattern of parallel lines with uniform widths and spaces. The pattern of sacrificial mandrels 150 shown in FIGS. 1A and 1B is understood by one or ordinary skill in the art to be "lithographically-friendly." As shown in FIGS. 1A and 1B, the sacrificial mandrel features 150 comprise elongated features which are spaced apart by pitch 2P and which have a width W. In one embodiment, the pitch 2P is about 60 nm or less, and the width W is in a range of about 10 nm to about 15 nm. The pitch 2P represents a pitch which is 2 times a target pitch P for the minimum feature width (X1) metal lines of a metal line pattern to be formed. The width W of the sacrificial mandrels 150 is less than the final pitch P of the metal line pattern to be formed. In one embodiment, the width W is about ½ of the final pitch P of the final metal line pattern. Furthermore, the sacrificial mandrels 150 have a height which is in a range of about 20 nm to about 50 nm.

The array of sacrificial mandrels 150 can be formed using known methods. For example, a layer of sacrificial insulating/dielectric material is deposited on the hardmask layer 140 and then patterned using known techniques to form the array of sacrificial mandrels 150. The layer of sacrificial insulating/dielectric material (which forms the sacrificial mandrels 150) may comprise any suitable material that has etch selectivity with respect to the material of the hardmask layer 140. For example, the sacrificial mandrels 150 can be formed of an oxide material when the hardmask layer 140 is formed of a nitride material. The layer of sacrificial insulating/dielectric material is deposited using CVD, PVD, or any suitable deposition method.

The layer of sacrificial insulating/dielectric material can be patterned using e-beam lithography, optical lithography, nanoimprint lithography, directed self-assembly of block copolymers, or a combination thereof, and related etch techniques. For example, the layer of sacrificial insulating/dielectric material can be etched using a photolithography process wherein, for example, a layer of "negative" photoresist material is deposited and patterned using a bright-field mask to form a photoresist mask which defines an image of the array of sacrificial mandrels 150. The array of sacrificial mandrels 150 is formed by transferring the image of the photoresist mask into the layer of sacrificial insulating/dielectric material using a suitable etch process. The etch process may be a dry plasma etch process (e.g., RIE (reactive ion etch)) having an etch chemistry that is suitable to etch the material of the sacrificial insulating/dielectric layer selective to the underlying hardmask layer 140. In this regard, the hardmask layer 140 serves as an etch stop for the etch process.

Figure 2:
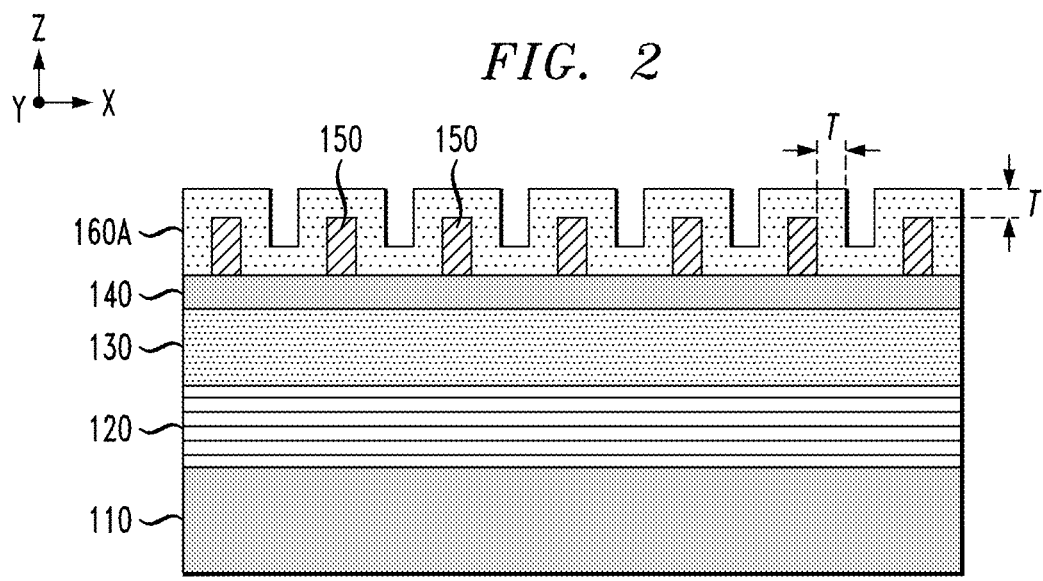
Figure 3A:
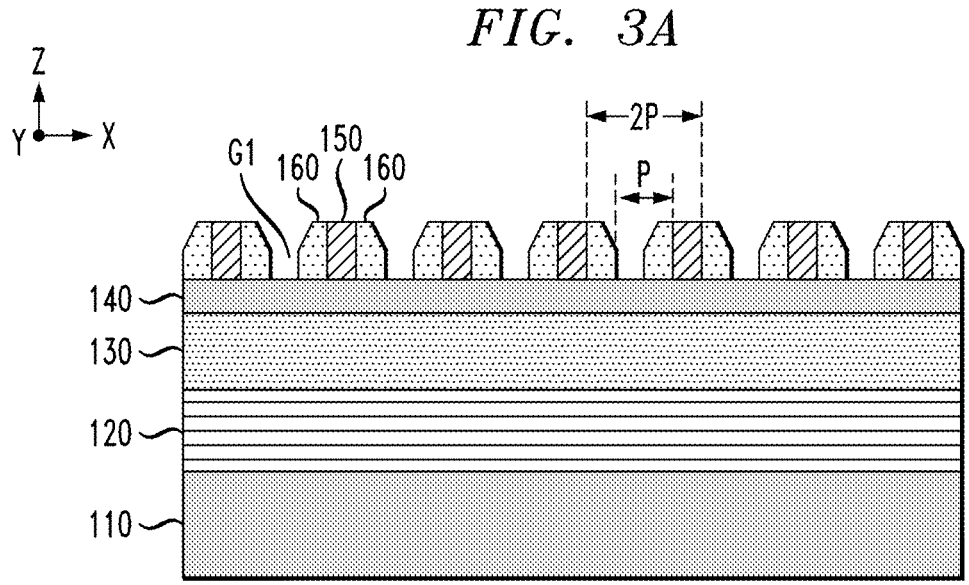
FIGS. 3A and 3B are schematic views of the semiconductor structure shown in FIG. 2 after patterning the conformal layer of spacer material to form spacers on vertical sidewalls of the sacrificial mandrels.
Figure 3B:
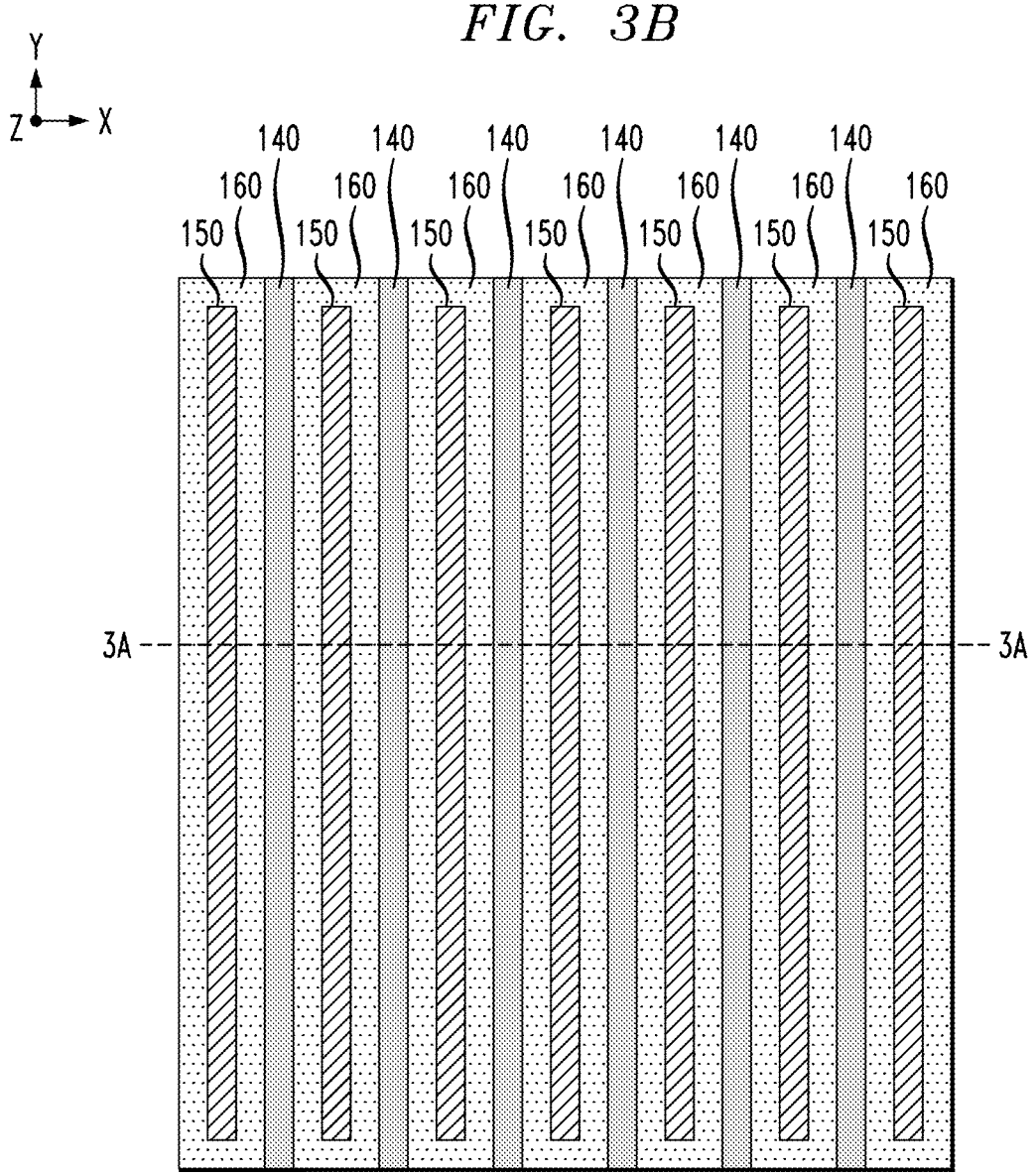

A next phase of the fabrication process comprises forming spacers on the sidewalls of the sacrificial mandrels 150 using a process flow as schematically illustrated in FIGS. 2, 3A, and 3B. For example, FIG. 2 is a schematic cross-sectional side view of the semiconductor structure of FIG. 1A after forming a conformal layer of spacer material 160A over the surface of the semiconductor structure to conformally cover the sacrificial mandrels 150. In one embodiment of the invention, the conformal layer of spacer material 160A comprises a dielectric/insulating material which is conformally deposited using known methods such as ALD or PVD. The conformal layer of spacer material 160A is preferably formed of a material which has etch selectivity with respect to the material of the sacrificial mandrels 150 and the hardmask layer 140. For example, the conformal layer of spacer material 160A can be formed of a silicon oxide, a silicon nitride, a silicon carbide, etc. In one example embodiment of the invention, the conformal layer of spacer material 160A is formed with a thickness T in a range of about 10 nm to about 15 nm on the vertical and horizontal surface of the semiconductor structures.

FIGS. 3A and 3B schematically illustrate a next step in the process flow which comprises patterning the conformal layer of spacer material 160A to form spacers 160 on the vertical sidewalls of the sacrificial mandrels 150. FIG. 3B is a schematic top plan view of the semiconductor structure shown in FIG. 3A, and FIG. 3A is a schematic cross-sectional side view of the semiconductor structure taken along line 3A-3A in FIG. 3B. In particular, FIG. 3A is a schematic cross-sectional side view of the semiconductor structure of FIG. 2 after performing a directional (anisotropic) etch process to etch away portions of the conformal layer of spacer material 160A on the upper surfaces of the sacrificial mandrels 150 and in the gaps G1 between vertical portions of the conformal layer of spacer material 160A on the sidewalls of the sacrificial mandrels 150. The anisotropic etch process results in the formation of spacers 160 on the sidewalls of the sacrificial mandrels 150.

In one embodiment of the invention, the spacer etch process is performed using a directional dry etch process (anisotropic), such as RIE, having an etch chemistry which is suitable to etch the spacer material selective to the materials of the sacrificial mandrel 150 and the underlying hardmask layer 140. In some embodiments, during the directional etch process, there is minimal or no etching of the underlying hardmask layer 140 when the "aspect ratio" of the open spaces between the features is large enough to effectively serve as an etch mask to prevent etching of the exposed portions of the hard mask layer 140, as is understood by those of ordinary skill in the art. The etch process results in the formation of the spacers 160 having a width that is substantially the same as the thickness T of the conformal layer of spacer material 160A.

Figure 4A:
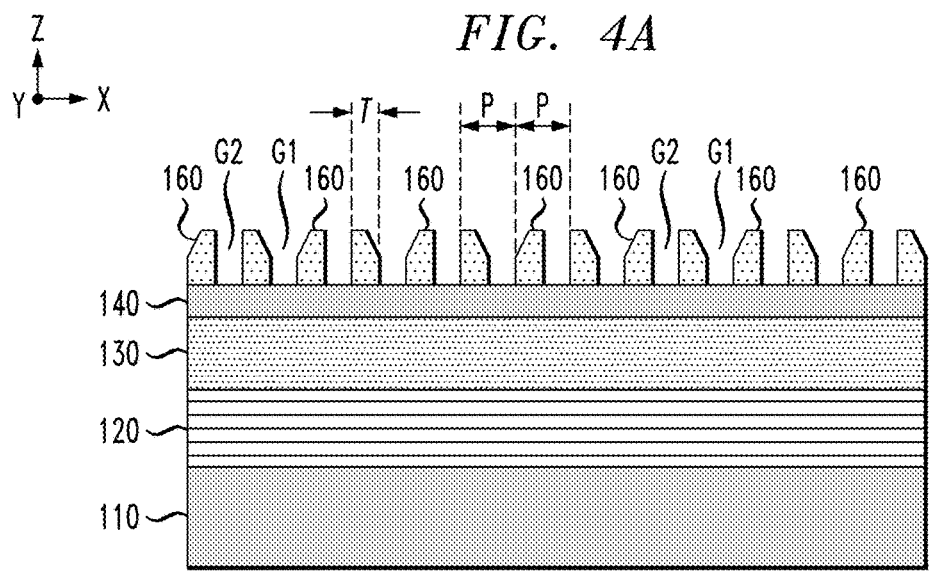
FIGS. 4A and 4B are schematic views of the semiconductor structure shown in FIGS. 3A and 3B, respectively, after removing the sacrificial mandrels while leaving the spacers on a hardmask layer.
Figure 4B:
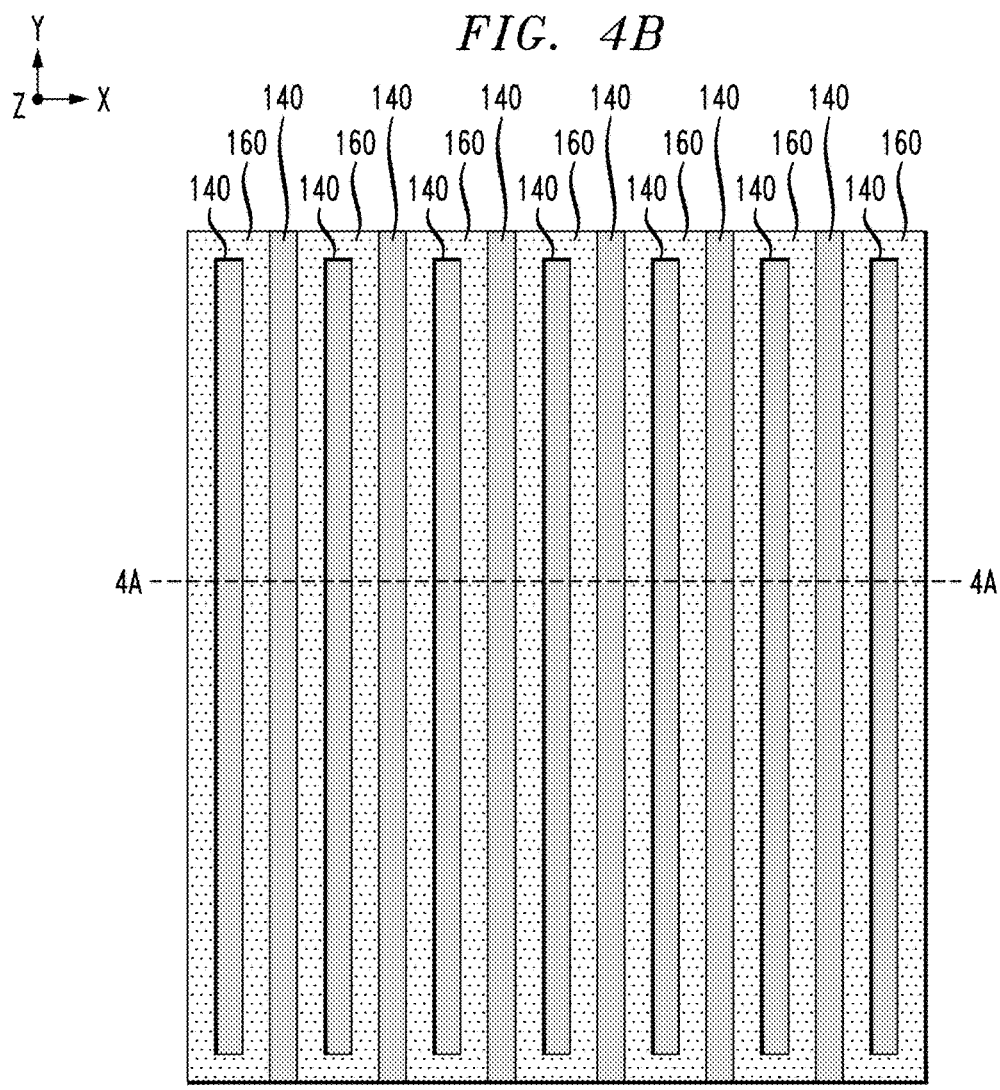

Next, FIGS. 4A and 4B are schematic views of the semiconductor structure shown in FIGS. 3A and 3B, respectively, after removing the sacrificial mandrels 150 while leaving the sidewall spacers 160 on the hardmask layer 140. The sacrificial mandrels 150 can be etched away selective to the spacers 160 using a RIE process with a suitable etch chemistry. In the resulting semiconductor structure shown in FIGS. 4A and 4B, the spacers 160 provide a spacer pattern with pitch P and width T, wherein the spacers 160 are separated by gaps G1 and G2, and wherein the gaps G2 represent the spaces that are formed after removing the sacrificial mandrels 150. The gaps G2 represent the mandrel assigned metal lines features (1X) to be formed in the underlying insulating layer 130, and the gaps G1 represent the non-mandrel assigned metal line features (1x) to be formed in the underlying insulating layer 130. The top plan view of FIG. 4B shows that end portions of pairs of adjacent spacers are connected by spacer material that was formed on the sidewall end portions of the sacrificial mandrels 150. However, with the SID process, it is the gaps G1 and G2, and not the spacers 160, which represent portions of the metal lines to be formed, so no cut mask is needed at this stage to remove the connecting portions of the spacers to avoid forming metallic loops.

As shown in FIGS. 4A and 4B, the number of elongated spacers 160 is essentially double the number of elongated sacrificial mandrels, and thus the pitch P of the spacer lines is half the pitch 2P of the sacrificial mandrel lines 150. This is due to the spacer material being deposited on each side of each sacrificial mandrel 150, which generates two elongated spacer features for every one sacrificial mandrel feature. This results in pitch splitting of the original sacrificial mandrel lines. As noted above, in a SID-based SADP process, the spacers 160 define the dielectric material between patterned trenches that will be filled with metallic material such as copper to form an array of interconnect wires.

Figure 5A:
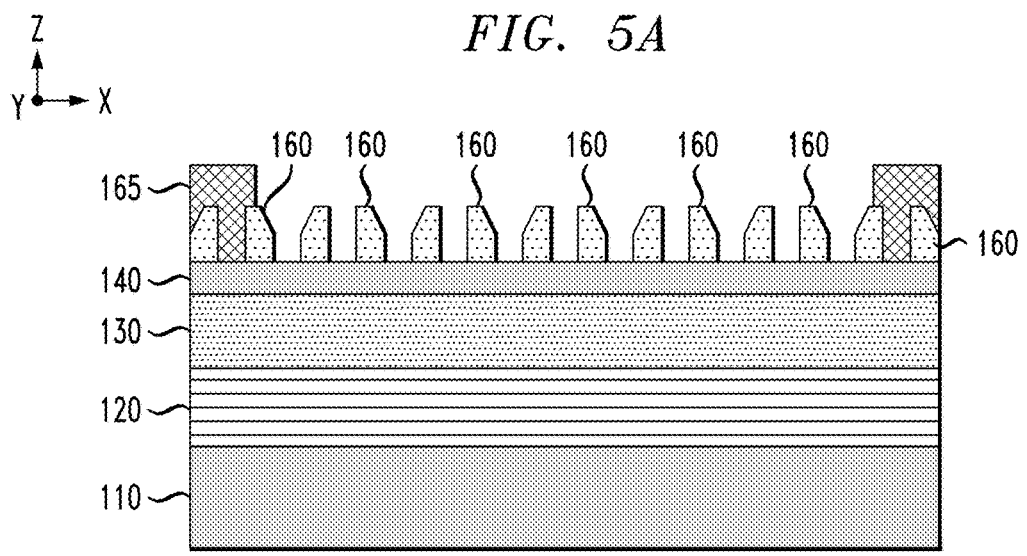
FIGS. 5A and 5B are schematic views of the semiconductor structure shown in FIGS. 4A and 4B, respectively, after forming a block mask to expose portions of the hardmask layer which are to be etched.

A next phase of the fabrication process comprises patterning the hard mask layer 140 using a process flow as schematically illustrated in FIGS. 5A through 9B. To begin, FIGS. 5A and 5B schematically illustrate the semiconductor structure of FIGS. 4A and 4B, respectively, after forming a block mask 165 to expose portions of the hard mask layer 140 which are to be etched. FIG. 5B is a schematic top plan view of the semiconductor structure shown in FIG. 5A, and FIG. 5A is a schematic cross-sectional side view of the semiconductor structure taken along line 5A-5A in FIG. 5B. The block mask 165 can be a dark-field photoresist mask which is formed using known methods. As shown in FIG. 5B, the block mask 165 comprises an opening that exposes a target region in which the hard mask layer 140 will be etched, while protecting the hard mask layer in other regions on the surface of the wafer.

Figure 5B:
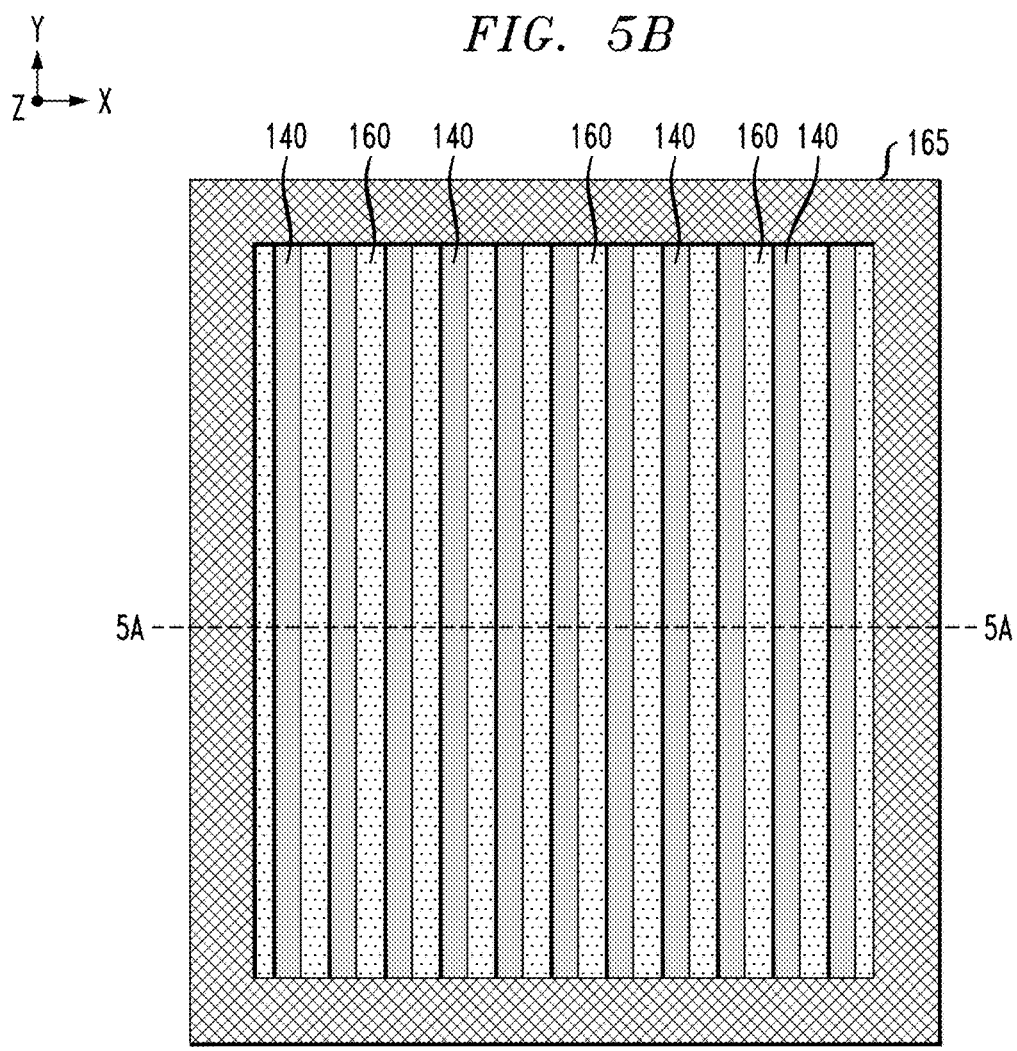
Figure 6A:
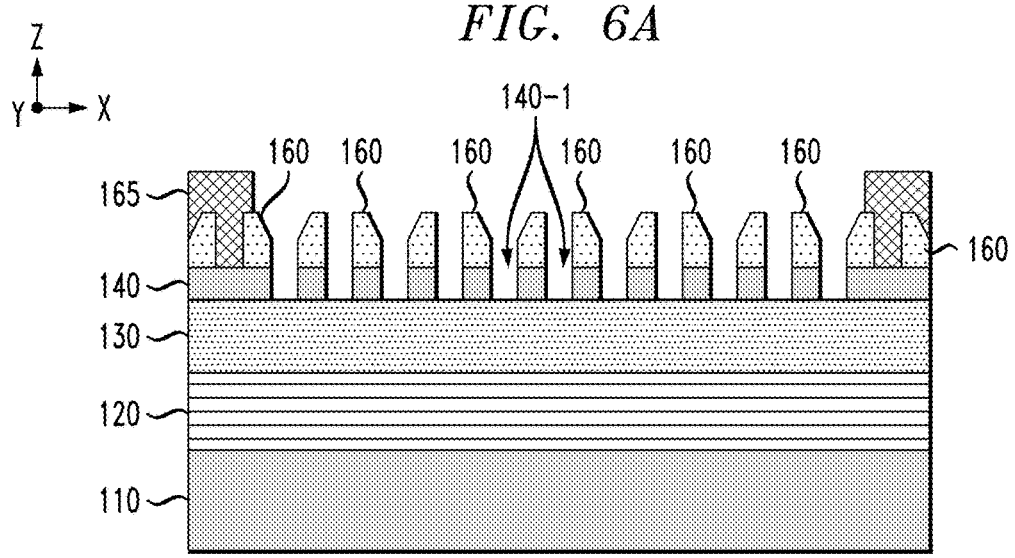
FIGS. 6A and 6B are schematic views of the semiconductor structure shown in FIGS. 5A and 5B, respectively, after patterning the hardmask layer using an etch mask that is collectively defined by the spacers and the block mask.
Figure 6B:
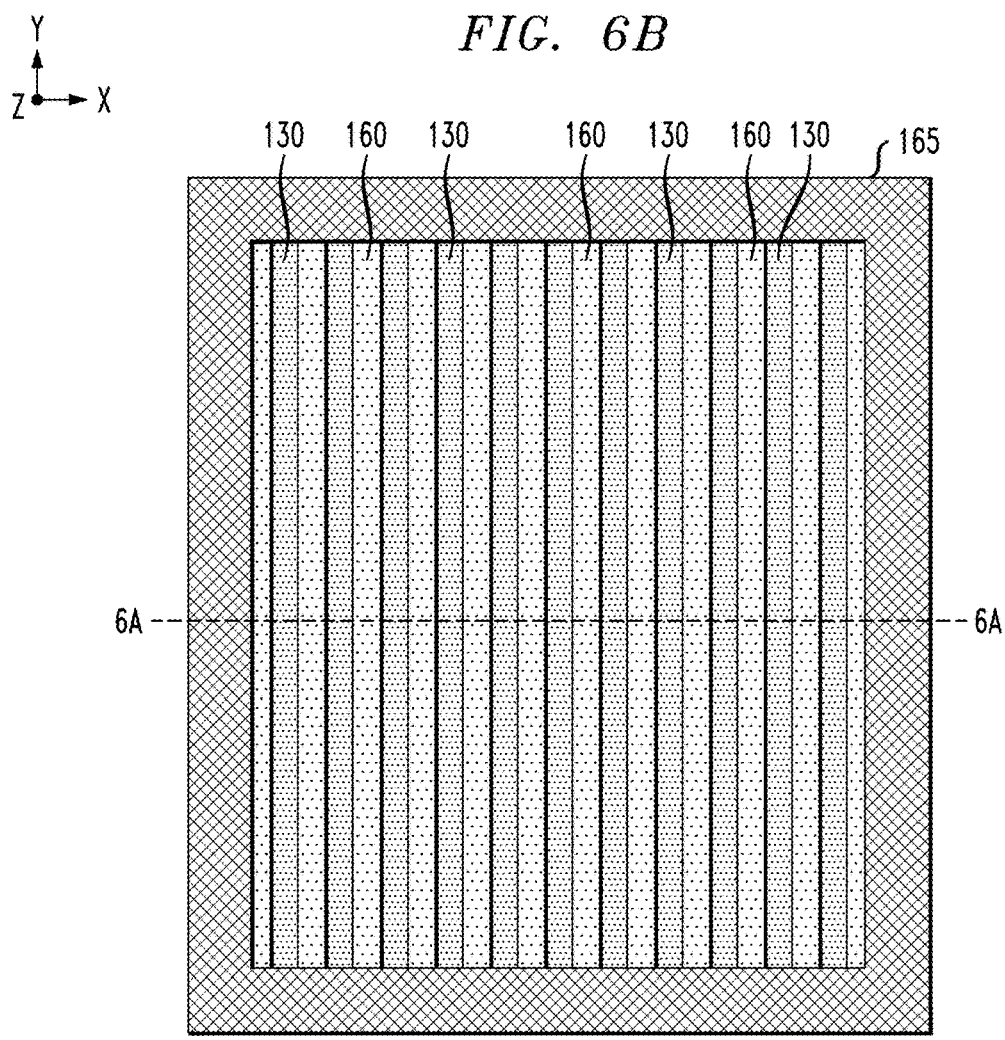

Next, FIGS. 6A and 6B schematically illustrate the semiconductor structure of FIGS. 5A and 5B, respectively, after patterning the hardmask layer 140 using an etch mask that is collectively defined by the spacers 160 and the block mask 165. FIG. 6B is a schematic top plan view of the semiconductor structure shown in FIG. 6A, and FIG. 6A is a schematic cross-sectional side view of the semiconductor structure taken along line 6A-6A in FIG. 6B. The exposed portions of the hardmask layer 140 are etched down to the insulating layer 130 using an anisotropic dry etch process (RIE) with an etch chemistry that is configured to etch the material of the hardmask layer 140 selective to the materials of the spacers 160 and the insulating layer 130.

Figure 7A:
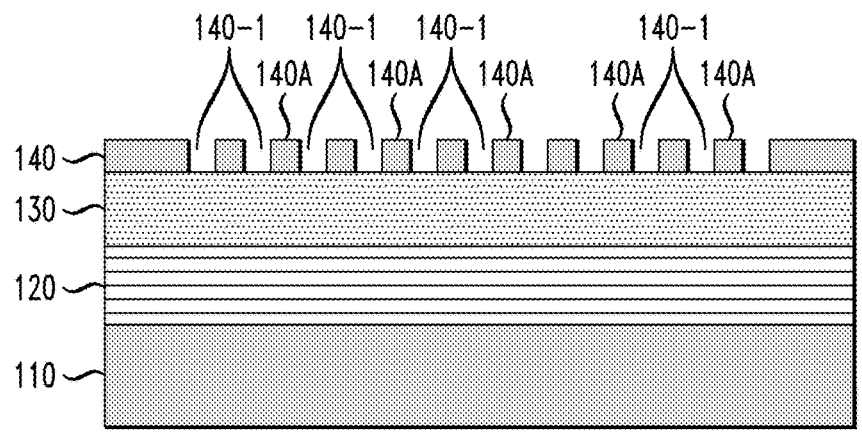
FIGS. 7A and 7B are schematic views of the semiconductor structure shown in FIGS. 6A and 6B, respectively, after removing the block mask and spacers to expose the patterned hardmask layer.
Figure 7B:
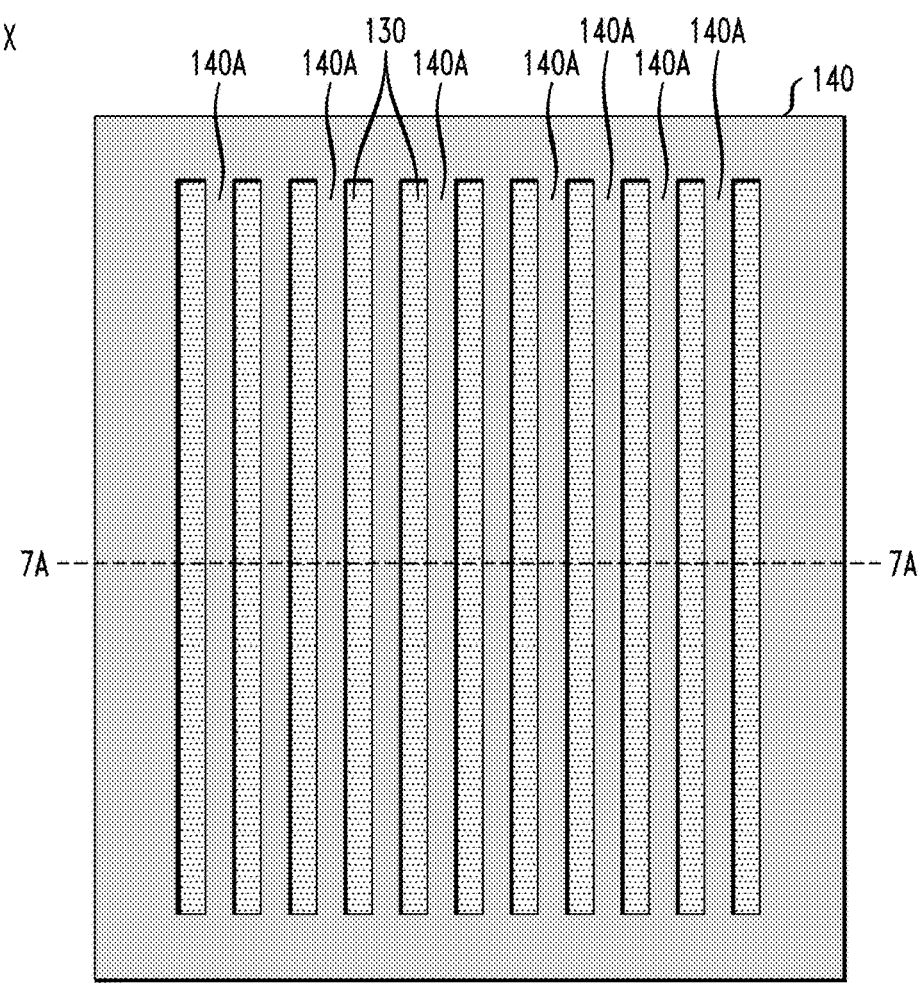

Next, FIGS. 7A and 7B schematically illustrate the semiconductor structure of FIGS. 6A and 6B, respectively, after removing the block mask. FIG. 7B is a schematic top plan view of the semiconductor structure shown in FIG. 7A, and FIG. 7A is a schematic cross-sectional side view of the semiconductor structure taken along line 7A-7A in FIG. 7B. As illustrated in FIGS. 7A and 7B, the etch process results in the formation of trenches 140-1 between hard mask features 140 of the patterned hardmask layer 140, wherein the trenches 140-1 define images of metal lines to be subsequently formed in the insulating layer 130. The trenches 140-1 define images of minimum width (X1) metal lines that are to be formed in the insulating layer 140. However, wider metal lines (e.g. X3, X5, etc.) can be formed by performing an additional etch process using an "unblock mask" to remove one or more of the hard mask features 140A prior to patterning the insulating layer 130 using the patterned hardmask layer 140.

Figure 8A:
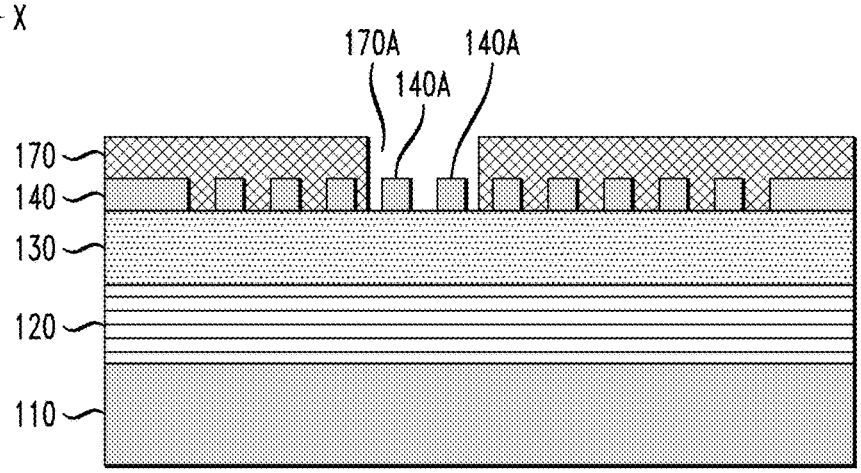
FIGS. 8A and 8B are schematic views of the semiconductor structure shown in FIGS. 7A and 7B, respectively, after forming an unblock mask to expose one or more features of the patterned hardmask layer which are to be removed prior to patterning an underlying insulating layer.
Figure 8B:
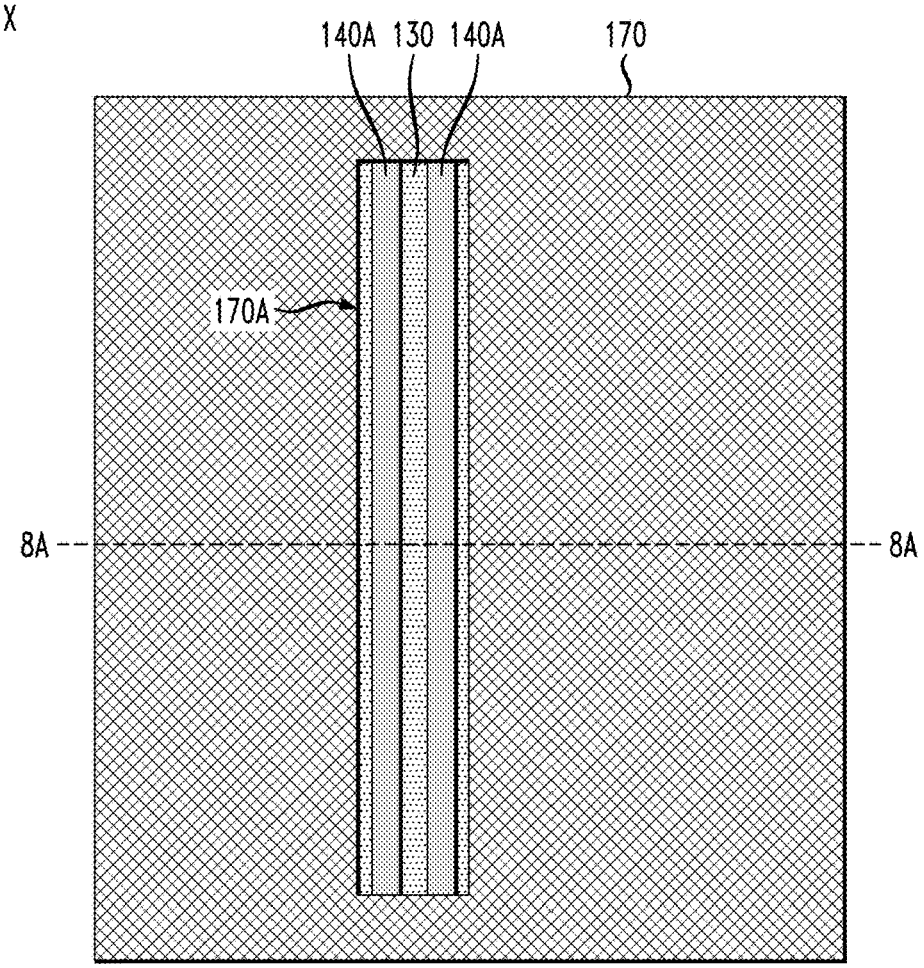

For example, FIGS. 8A and 8B schematically illustrate the semiconductor structure of FIGS. 7A and 7B, respectively, after forming an "unblock mask" 170 to expose one or more features 140A of the patterned hardmask layer 140 which are to be removed prior to patterning the insulating layer 130. FIG. 8B is a schematic top plan view of the semiconductor structure shown in FIG. 8A, and FIG. 8A is a schematic cross-sectional side view of the semiconductor structure taken along line 8A-8A in FIG. 8B. As shown in FIGS. 8A and 8B, the unblock mask 170 comprises an opening 170A that exposes two patterned features 140A of the hardmask layer 140. The exposed patterned features 140A are etched away to form an opening in the hardmask layer 140 which defines an image of a metal line that is wider than the X1 metal lines defined by the patterned trenches 140-1. In this regard, the unblock mask 170 is utilized to define wide wires by overlapping mandrel and non-mandrel features.

Figure 9A:
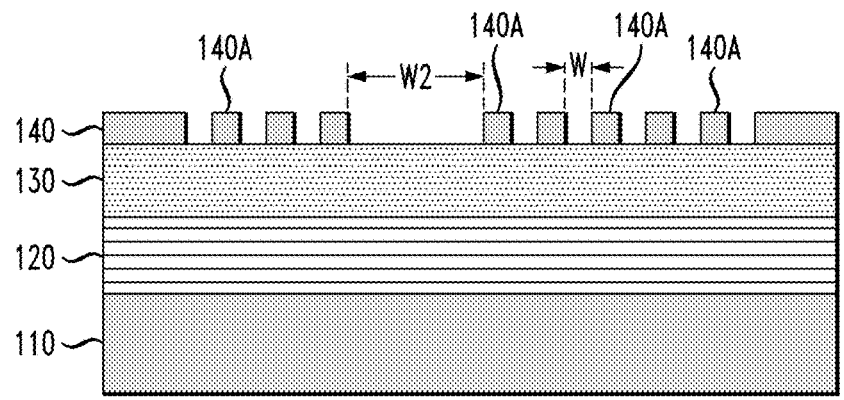
FIGS. 9A and 9B are schematic views of the semiconductor structure shown in FIGS. 8A and 8B, respectively, after etching away the exposed features of the patterned hardmask layer, which are exposed through an opening of the unblock mask and after removing the unblock mask.
Figure 9B:
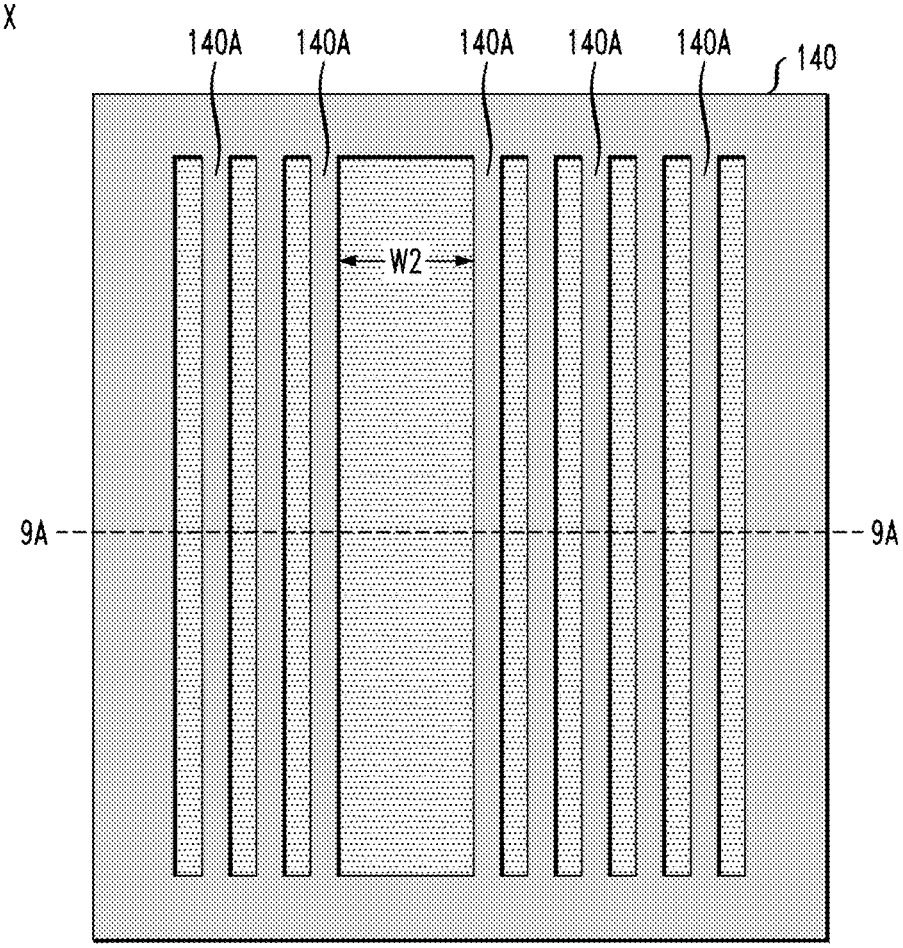

In particular, FIGS. 9A and 9B schematically illustrate the semiconductor structure of FIGS. 8A and 8B, respectively, after etching away the hardmask features 140A exposed through the opening 170A of the unblock mask 170 and removing the unblock mask 170. FIG. 9B is a schematic top plan view of the semiconductor structure shown in FIG. 9A, and FIG. 9A is a schematic cross-sectional side view of the semiconductor structure taken along line 9A-9A in FIG. 9B. The etch process can be performed using an RIE process with an etch chemistry that is configured to etch away the exposed hardmask features 140A selective to the insulating layer 130. As shown in FIGS. 9A and 9B, the etch process results in the formation of a trench opening 140-2 in the patterned hardmask layer which has a width W2 that is greater than the width W of the trench openings 140-1. The trench opening 140-2 in the hardmask layer 140 defines an image of a metal line that is wider (X5) than the minimum width (X1) of the metal lines defined by the patterned trenches 140-1.

Figure 10:
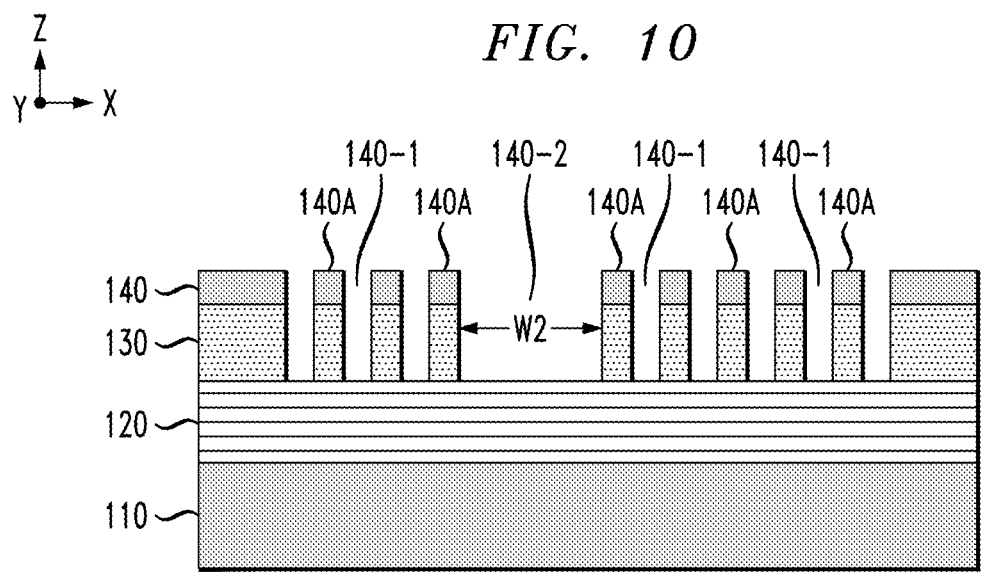

Next, FIG. 10 is a schematic cross-sectional side view of the semiconductor structure shown in FIG. 9A after patterning the insulating layer 130 using the patterned hardmask layer 140 as an etch hardmask. As schematically illustrated in FIG. 10, the etch process results in transferring an image of the patterned hardmask layer 140 into the insulting layer 130 to form trenches in the insulating layer 130 which correspond to the trenches 140-1 and 140-2 of the patterned hardmask layer 140. The insulating layer 130 can be etched using a RIE process having an etch chemistry which is configured to selectively etch exposed portions of the insulating layer 130 down to the MOL layer of the FEOL/MOL layer 120.

The trench openings formed in the insulating layer 130 are subsequently lined with a thin barrier diffusion layer and filled with conductive material (e.g., copper) to form metal lines. For example, FIGS. 11A and 11B schematically illustrate the semiconductor structure of FIG. 10 after filling the trenches in the insulating layer 130 to form an array of metal lines 180. FIG. 11B is a schematic top plan view of the semiconductor structure shown in FIG. 11A, and FIG. 11A is a schematic cross-sectional side view of the semiconductor structure taken along line 11A-11A in FIG. 11B. As shown in FIGS. 11A and 11B, the array of metal lines 180 comprises a plurality of metal lines 181 having a minimum width W, and at least one metal line 182 having a width W2 which is greater than the minimum width W. In the example embodiment, the metal line 182 has a width W2 which is 5× the minimum width.

While the above process flow describes an example embodiment in which one wide metal line 182 is formed in an array of minimum width metal lines 181, the same techniques can be utilized to form any suitable array of metal lines comprising variable width metal lines using different unblock mask patterns. For example, FIGS. 12, 13A, and 13B schematically illustrate a multi-patterning method for fabricating an array of metal lines comprising metal lines with different widths, according to another embodiment of the invention.

Figure 12:
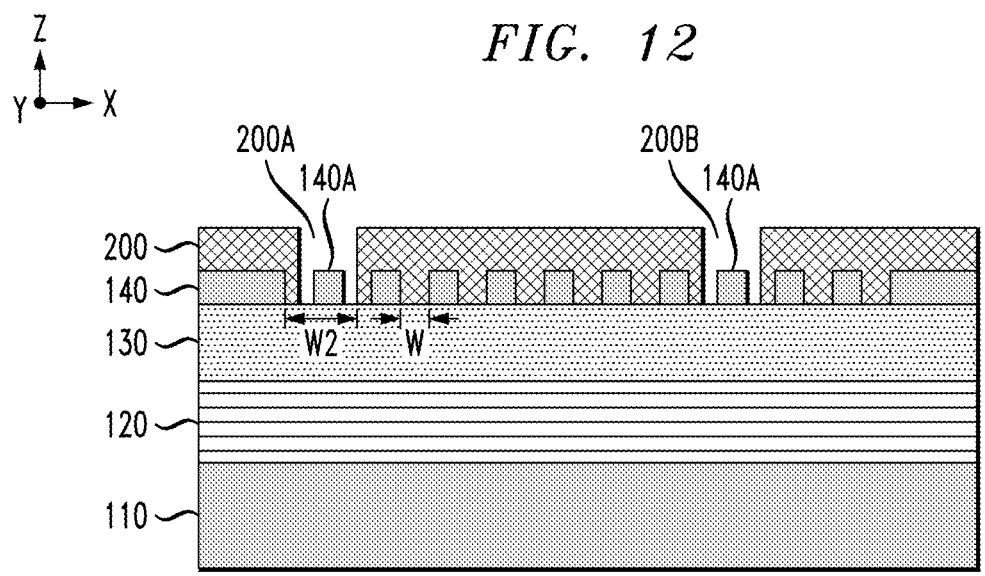

In particular, FIG. 12 is a schematic cross-sectional side view of the semiconductor structure shown in FIG. 7A, after forming a unblock mask 200 comprising two separate openings 200A and 200B to expose non-adjacent hardmask features 140A in different regions of the patterned hardmask layer 140, which are to be removed prior to patterning the insulating layer 130. In the example embodiment of FIG. 12, each opening 200A and 200B of the unblock mask 200 exposes a single hardmask feature 140A, and the exposed features 140A are etched away to form wide openings of width W2 in the hardmask layer 140, which are wider than the minimum width W. In this example embodiment, the width W2 is 3× the minimum width W. In this regard, it is to be appreciated that an unblock mask can be formed in any desired pattern to define wide wires in any target region by overlapping mandrel and non-mandrel features.

A similar process flow as described above is implemented to etch away the hardmask features 140A exposed through the openings 200A and 200B of the unblock mask 200, remove the unblock mask 200, pattern the insulating layer 130 using the patterned hardmask layer 140 as an etch hardmask to form trenches in the insulating layer 130, and then fill the trenches will metallic material to form an array of metal lines in the insulating layer 130. For example, FIGS. 13A and 13B schematically illustrate the semiconductor structure of FIG. 12 after patterning the hardmask layer using the unblock mask 200, removing the unblock mask 200, patterning the insulating layer 130 using the patterned hardmask layer 140 as an etch hardmask to form trenches in the insulating layer 130, and then filling the trenches with a metallic material (e.g., copper) to form an array of metal lines 280 in the insulating layer 130. FIG. 13B is a schematic top plan view of the semiconductor structure shown in FIG. 13A, and FIG. 13A is a schematic cross-sectional side view of the semiconductor structure taken along line 13A-13A in FIG. 13B.

As shown in FIGS. 13A and 13B, the array of metal lines 280 comprises a plurality of metal lines 181 having a minimum width W, and at least two metal lines 282 having a width W2 which is greater than the minimum width W. In the example embodiment, the metal lines 282 have a width W2 which is 3× the minimum width W. This example embodiment illustrates that wider metal lines 282 can formed in any desired region of an array of minimum width W metal lines, and that such wider metal lines need not be formed adjacent to each, as required in conventional methods.

While the above process flows illustrate example embodiments for forming an array of metal lines which are parallel and continuous, the above exemplary process flows can be extended to include the use of "cut" masks to form cuts in the metal lines. For example, FIGS. 14A through 17 schematically illustrate a multi-patterning method for fabricating an array of metal lines comprising metal lines with different widths and cuts, according to another embodiment of the invention.

Figure 14A:
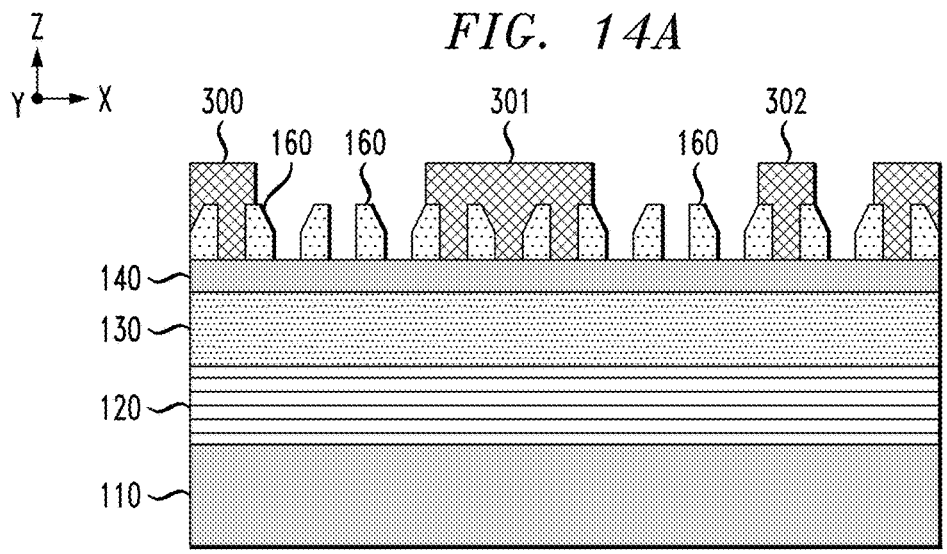
Figure 14B:
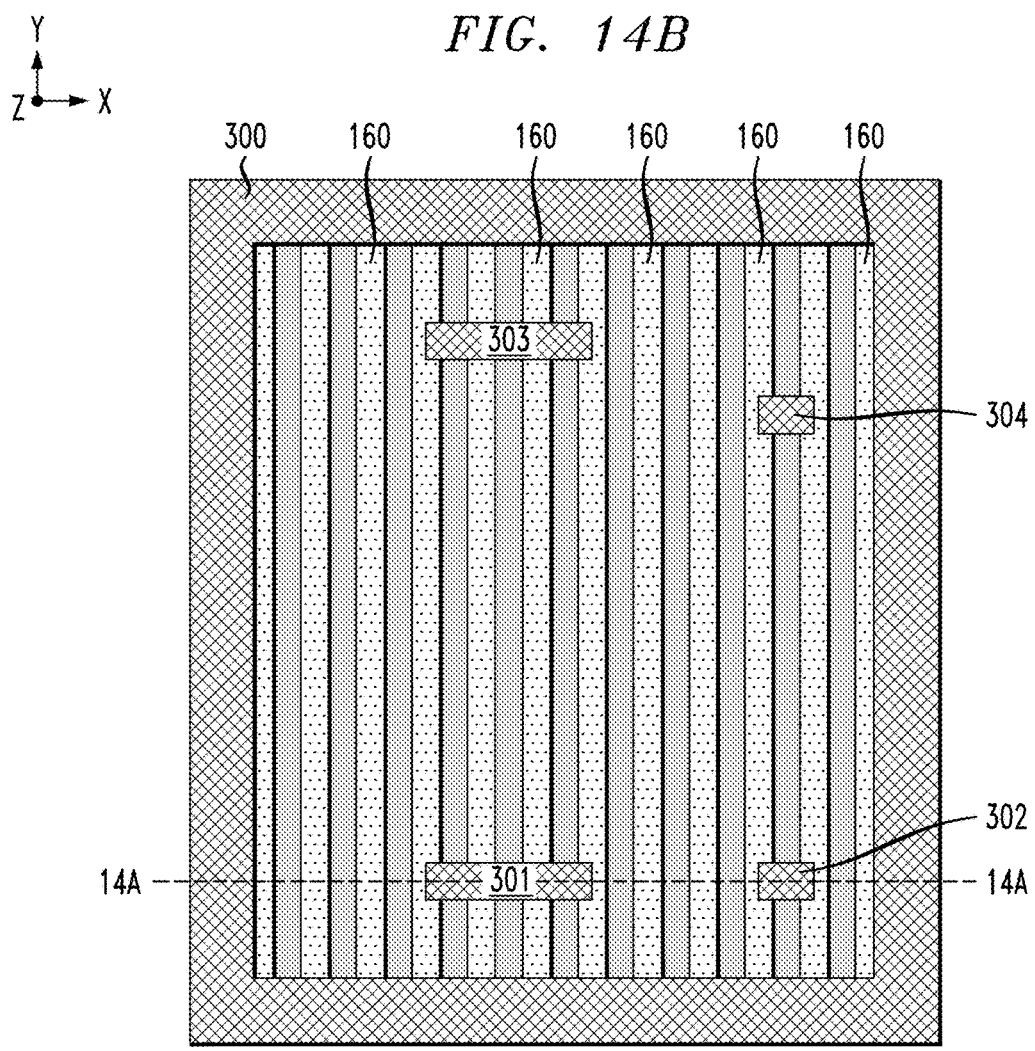

In particular, FIGS. 14A and 14B schematically illustrate the semiconductor structure of FIGS. 4A and 4B, respectively, after forming a cut mask 300 to expose portions of the hard mask layer 140 which are to be etched, while covering portions of the hardmask layer 140 which will not be etched. FIG. 14B is a schematic top plan view of the semiconductor structure shown in FIG. 14A, and FIG. 14A is a schematic cross-sectional side view of the semiconductor structure taken along line 14A-14A in FIG. 14B. As shown in FIGS. 14A and 14B, the cut mask 300 comprises an opening that exposes a target region in which the hard mask layer 140 will be etched, while protecting the hard mask layer in other regions on the surface of the wafer. The cut mask 300 further comprises a plurality of cut patterns 301, 302, 303, and 304 disposed within the target region to cover portions of the hardmask layer 140 which are to be protected from being etched, and which are subsequently utilized to form cuts in metal lines.

Figure 15A:
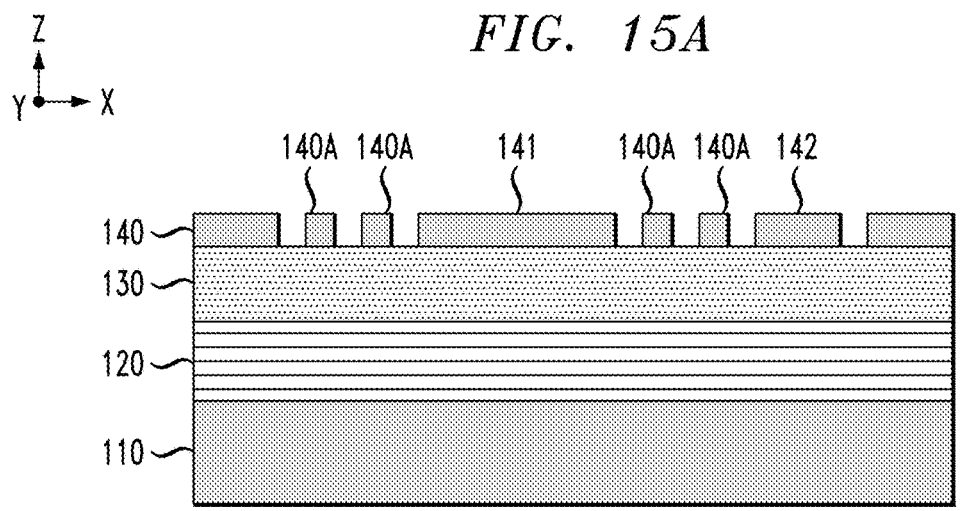
FIGS. 15A and 15B are schematic views of the semiconductor structure shown in FIGS. 14A and 14B, respectively, after patterning the hardmask layer using an etch mask that is collectively defined by the spacers and the cut mask, and after removing the spacers and the cut mask to expose the resulting patterned hardmask layer.
Figure 15B:
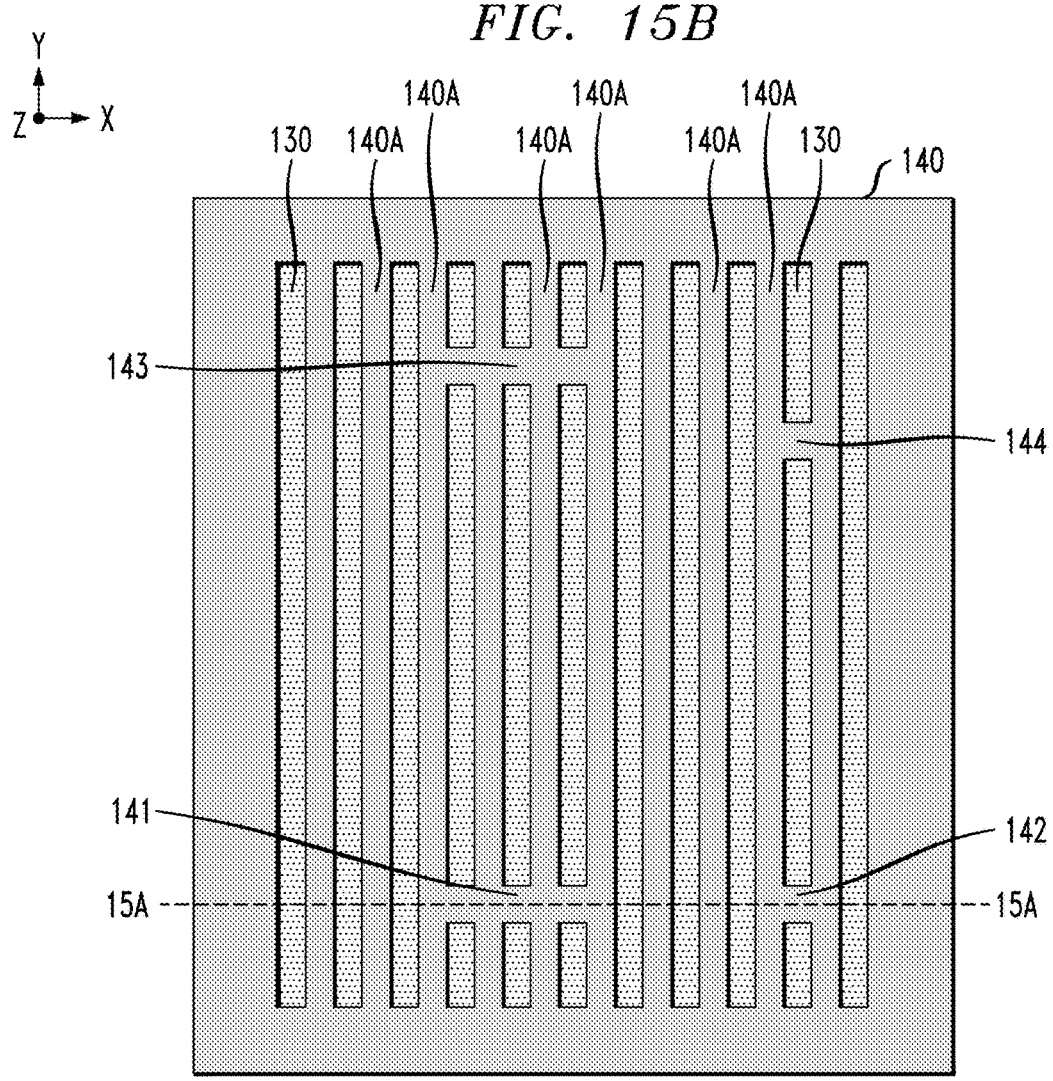

Next, FIGS. 15A and 15B schematically illustrate the semiconductor structure shown in FIGS. 14A and 14B, respectively, after patterning the hardmask layer 140 using an etch mask that is collectively defined by the spacers 160 and the cut mask 300, and after removing the spacers 160 and the cut mask 300 to expose the resulting patterned hardmask 140. FIG. 15B is a schematic top plan view of the semiconductor structure shown in FIG. 15A, and FIG. 15A is a schematic cross-sectional side view of the semiconductor structure taken along line 15A-15A in FIG. 15B. As illustrated in FIGS. 15A and 15B, the etch process results in the formation of line cut hardmask portions 141, 142, 143, and 144 which define images of cuts in metal lines that are subsequently formed. The line cut hardmask portions 141, 142, 143, and 144 correspond to the cut mask patterns 301, 302, 303, and 304 of the cut mask 300 shown in FIG. 14B.

Figure 16:
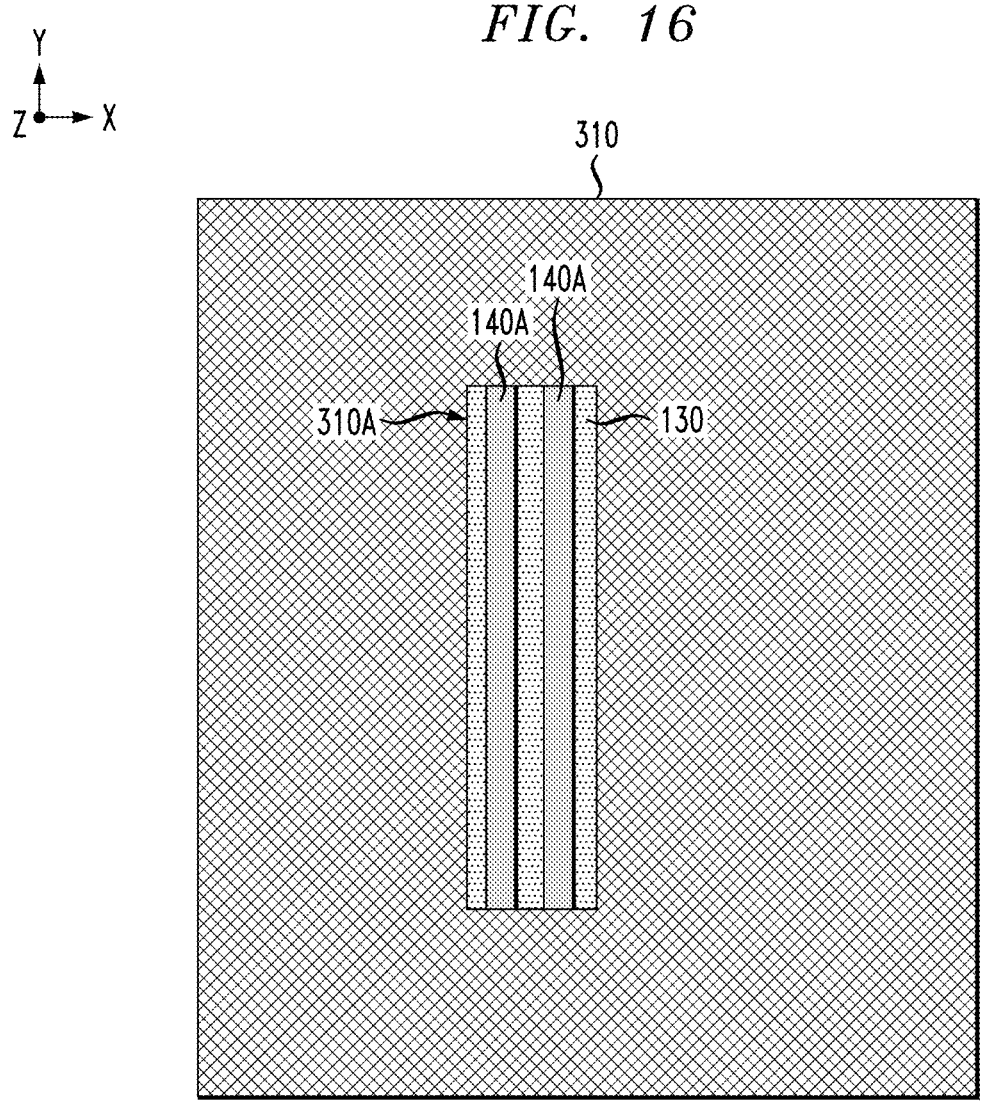

Next, FIG. 16 is a schematic top plan view of the semiconductor structure of FIG. 15B after forming a "unblock mask" 310 to expose portions of the patterned hardmask layer 140 which are to be removed prior to patterning the insulating layer 130. As shown in FIG. 16, the unblock mask 310 comprises an opening 310A which exposes portions of two adjacent patterned features 140A of the hardmask layer 140. Similar to the embodiments discuss above, the exposed patterned features 140A are etched away to form an opening in the hardmask layer 140 which defines an image of a metal line that is wider than the minimum width W metal lines.

Finally, FIG. 17 is a schematic top plan view of the semiconductor structure of FIG. 16 after removing the unblock mask 310, patterning the insulating layer 130 using the patterned hardmask layer 140 as an etch mask to etch trenches in the insulating layer 130, and then filling the trenches with a metallic material (e.g., copper) to form an array of metal lines in the insulating layer 130. As shown in FIG. 17, the array of metal lines comprises a plurality of metal lines 181 having a minimum width W, and at least one metal line 352 having a width W2 which is greater than the minimum width W. In the example embodiment, the metal line 352 has a width W2 which is 5× the minimum width W.

As further shown in FIG. 17, the end portions of the wide metal line 352 are isolated from a plurality of minimum width metal lines 181 via line cut regions 131 and 133 of the insulating layer 130, and the end portions of at least one shortened minimum width metal line 181A are isolated by line cut regions 132 and 134. The images of the line cut regions 131, 132, 133 and 134 in the insulating layer 130 correspond to the images of the respective line cut hardmask portions 141, 142, 143, and 144. This example embodiment illustrates that wider metal lines 352 can formed in any desired region of an array of minimum width W metal lines, while using standard cut mask techniques as part of the process flow to cut any desired wide and/or minimum width metal line in an array of metal lines.

Figure 18A:
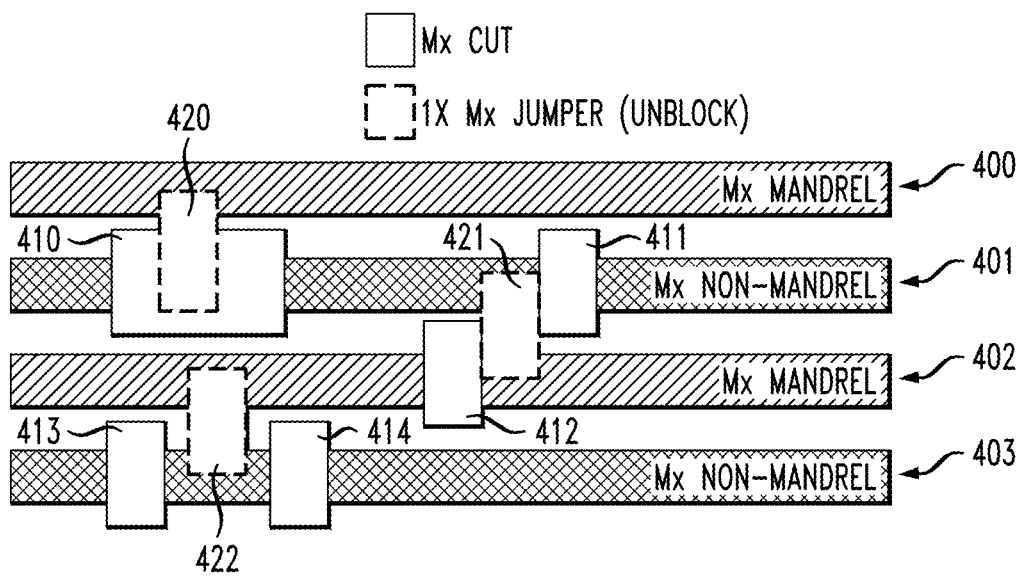
FIGS. 18A and 18B schematically illustrate a multi-patterning method in which a cut mask and an unblock mask are utilized in the multi-patterning process flow to form input/output (I/O) wire segments and wire jumper segments for rerouting metal lines, according to another embodiment of the invention.
Figure 18B:
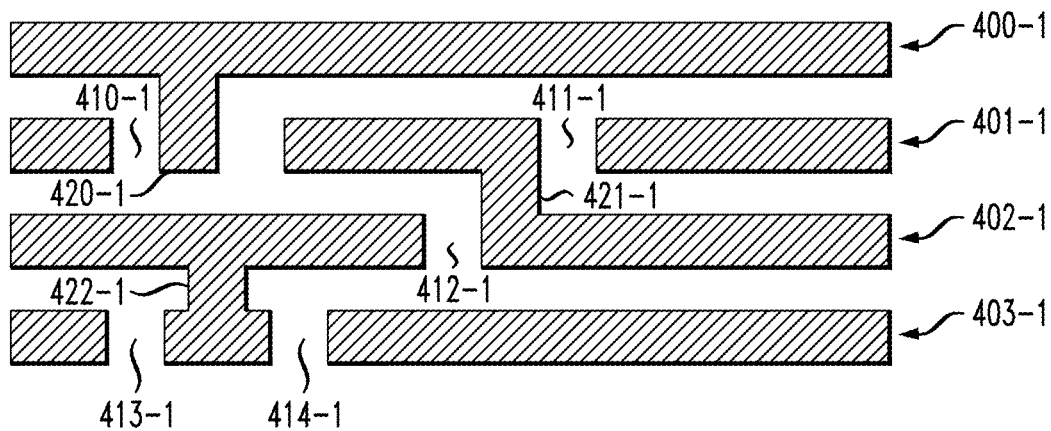

FIGS. 18A and 18B schematically illustrate a multi-patterning method in which a cut mask and an unblock mask are utilized in the multi-patterning process flow to form input/output (I/O) wire segments and wire jumper segments for rerouting metal lines, according to another embodiment of the invention. FIG. 18A schematically illustrates a plurality of mandrel assigned features 400 and 402, and non-mandrel assigned features 401 and 403, which define a pattern of metal lines to be formed in an insulating layer using techniques as discussed above. The mandrel and non-mandrel assigned features 400, 401, 402, and 403 represent the gaps between the patterned SID spacers. In particular, as with the example embodiments discussed above, the mandrel assigned features 400 and 402 represent the metal lines that are defined by the spaces (e.g., gaps G2, FIG. 4A) that are created by removing the sacrificial mandrels, and the non-mandrel assigned features 401 and 403 represent the metal lines that are defined by the spaces (e.g., gaps G1, FIG. 4A) which are formed between adjacent sidewall spacers disposed on adjacent mandrels. The spaces adjacent to and between the mandrel and non-mandrel assigned features 400, 401, 402, and 403 represent the spacer pattern that is formed on the sidewalls of the sacrificial mandrels.

FIG. 18A further illustrates a cut mask pattern comprising a plurality of cut patterns 410, 411, 412, 413, and 414 disposed at target areas to cover portions of an underlying hardmask layer (not shown) that are exposed through the mandrel and non-mandrel assigned features 401, 402, 403, and 404, and which are to be protected from being etched. The cut patterns 410, 411, 412, 413, and 414 are formed and utilized to pattern the underlying hardmask layer using the same or similar methods as discussed above with reference to FIGS. 14A, 14B, 15A, and 15B.

FIG. 18A further illustrates a unblock mask pattern comprising a plurality of openings 420, 421, and 422 which are formed in the unblock mask at target areas to expose portions of the underlying (patterned) hardmask layer (not shown) which are to be etched away to etch openings in the insulating layer to form I/O wire segments and wire jumper segments for rerouting metal lines. The unblock mask pattern with openings 420, 421, and 422 is formed and utilized to further pattern the underlying (patterned) hardmask layer using the same or similar methods as discussed above with reference to, e.g., FIGS. 8A, 8B, 16, etc. While the cut and unblock mask patterns are concurrently shown in FIG. 18A for illustrative purposes, it is to be understood that the cut and unblock mask patterns are formed and utilized at different stages of the process flow to pattern the underlying hard mask layer, similar to the exemplary methods discussed above.

FIG. 18B schematically illustrates a metallization pattern that is generated using the cut and unblock masks of FIG. 18A. In particular, the FIG. 18B illustrates metal lines 400-1, 401-1, 402-1, and 403-1, which correspond to the mandrel/non-mandrel assigned features 400, 401, 402, and 403, respectively. The metal line 400-1 comprises an I/O pin segment 420-1 which extends therefrom, and which corresponds to the unblock mask opening 420. The metal line 401-1 comprises cuts 410-1 and 411-1, which correspond to the cut patterns 410 and 411, respectively. The metal line 402-1 comprises a cut 412-1 which corresponds to the cut pattern 412. A wire jumper segment 421-1 connects a portion of the metal line 401-1 to a portion of the metal line 402-1 to form a re-routing metal line. The wire jumper segment 421-1 corresponds to the unblock mask opening 421. A portion of the metal line 402-1 comprises an I/O pin segment 422-1 which extends therefrom and connects to a portion of the metal line 403-1. The metal line 403-1 comprises cut portions 413-1 and 414-1 which correspond to the cut patterns 413 and 414, respectively. While FIGS. 18A and 18B schematically illustrate methods for utilizing cut masks and unblock masks in a multi-patterning process flow to form I/O wire segments and wire jumper segments for rerouting metal lines, it to be understood that such techniques can be incorporated as part of the fabrication process flows discussed herein in which cut masks and unblock masks are used to form an array of wide and narrow metal lines.

It is to be understood that the patterning methods discussed herein can be incorporated within semiconductor processing flows for fabricating various types of semiconductor devices and integrated circuits having analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
    forming a hardmask layer on an insulating layer of a substrate;
    forming a pattern of elongated sacrificial features over the hardmask layer, wherein the elongated sacrificial features are spaced apart at a first pitch, and wherein spaces between adjacent ones of the elongated sacrificial features define a minimum width of metal lines to be formed in the insulating layer;
    patterning the hardmask layer using the pattern of elongated sacrificial features as an etch mask to form an etch hardmask, wherein the etch hardmask comprises elongated trenches formed down to the insulating layer, wherein the elongated trenches of the etch hardmask have widths that are equal to the minimum width;
    removing the pattern of elongated sacrificial features to expose the etch hardmask;
    forming an unblock mask over the etch hardmask, wherein the unblock mask comprises an opening to expose a portion of the etch hardmask;
    removing the portion of the etch hardmask that is exposed through the opening of the unblock mask to form a wider elongated trench in the etch hardmask, wherein the wider elongated trench has a second width which is greater than the minimum width of the elongated trenches of the etch hardmask;
    removing the unblock mask;
    patterning the insulating layer using the etch hardmask to form a pattern of elongated trenches in the insulating layer, wherein the pattern of elongated trenches in the insulating layer comprises elongated trenches having the minimum width, and at least one wider elongated trench having the second width; and
    filling the elongated trenches in the insulating layer with metallic material to form a pattern of metal lines, wherein the pattern of metal lines comprises metal lines having the minimum width and at least one wider metal line having the second width.

2. The method of claim 1, wherein forming the pattern of elongated sacrificial features over the hardmask layer, comprises:
    forming a pattern of elongated sacrificial mandrels on the hardmask layer, wherein the elongated sacrificial mandrels are spaced apart at a second pitch which at least double the first pitch;
    forming a conformal layer of spacer material over the pattern of elongated sacrificial mandrels;

patterning the conformal layer of spacer material to form spacers on sidewalls of the elongated sacrificial mandrels; and removing the elongated sacrificial mandrels while leaving the spacers on the hardmask layer, wherein the spacers form said pattern of elongated sacrificial features on the hardmask layer.

3. The method of claim 1, wherein removing the portion of the etch hardmask that is exposed through the opening of the unblock mask to form a wider elongated trench in the etch hardmask, comprises removing at least one elongated portion of the etch hardmask layer between adjacent elongated trenches of the hardmask layer to form the wider elongated trenches in the etch hard mask.

4. The method of claim 1, wherein the second width of the at least one wider metal line is at least 3× wider than the minimum width.

5. The method of claim 1, wherein the pattern of metal lines is comprises at least a first metal line and a second metal line which have the minimum width and which are disposed next to the at least one wider metal line on opposite elongated sides of the at least one wider metal line.

6. The method of claim 1, wherein patterning the hardmask layer using the pattern of elongated sacrificial features as an etch mask to form an etch hardmask, further comprises:

forming a block mask over a portion of the elongated sacrificial features and the hardmask layer; and patterning the hardmask layer using an etch mask collectively formed by the block mask and exposed portions of the elongated sacrificial features.

7. The method of claim 1, wherein patterning the hardmask layer using the pattern of elongated sacrificial features as an etch mask to form an etch hardmask, further comprises:

forming a cut mask over a portion of the elongated sacrificial features and the hardmask layer; and patterning the hardmask layer using an etch mask collectively formed by the cut mask and exposed portions of the elongated sacrificial features.

8. The method of claim 1, wherein the insulating layer comprises an interlevel dielectric (ILD) layer of a back-end-of-line (BEOL) structure.

9. The method of claim 1, wherein the metal lines are formed of copper.

10. A method, comprising:

forming a hardmask layer on an insulating layer of a substrate;

patterning the hardmask layer using a spacer-is-dielectric (SID) self-aligned doubled patterning (SADP) process to form an etch hardmask, wherein the etch hardmask comprises elongated trenches formed down to the insulating layer, wherein the elongated trenches of the etch hardmask have widths that are equal to a minimum width of metal lines to be formed in the insulating layer;

forming an unblock mask over the etch hardmask, wherein the unblock mask comprises an opening which exposes a portion of adjacent mandrel-assigned and non-mandrel assigned regions;

removing a portion of the etch hardmask that is exposed through the opening of the unblock mask to form a wider elongated trench in the etch hardmask, wherein the wider elongated trench has a second width which is greater than the minimum width;

removing the unblock mask;

patterning the insulating layer using the etch hardmask to form a pattern of elongated trenches in the insulating layer, wherein the pattern of elongated trenches in the insulating layer comprises elongated trenches having the minimum width, and at least one wider elongated trench having the second width; and filling the elongated trenches in the insulating layer with metallic material to form a pattern of metal lines, wherein the pattern of metal lines comprises metal lines having the minimum width and at least one wider metal line having the second width.

11. The method of claim 10, wherein the second width of the at least one wider metal line is at least 3× wider than the minimum width.

12. The method of claim 10, wherein the pattern of metal lines comprises at least a first metal line and a second metal line which have the minimum width and which are disposed next to the at least one wider metal line on opposite elongated sides of the at least one wider metal line.

13. The method of claim 10, wherein patterning the hardmask layer using the SID SADP process comprises utilizing a block mask to pattern the hardmask layer.

14. The method of claim 10, wherein patterning the hardmask layer using the SID SADP process comprises utilizing a cut mask to pattern the hardmask layer.

15. The method of claim 10, wherein the insulating layer comprises an interlevel dielectric (ILD) layer of a back-end-of-line (BEOL) structure.

16. The method of claim 10, wherein the metal lines are formed of copper.

* * * * *